United States Patent
Saika

(10) Patent No.: US 8,302,057 B2
(45) Date of Patent: Oct. 30, 2012

(54) STANDARD CELL LIBRARY AND SEMICONDUCTOR INTEGRATED CIRCUIT

(75) Inventor: Shunji Saika, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/168,813

(22) Filed: Jun. 24, 2011

(65) Prior Publication Data

US 2011/0252392 A1   Oct. 13, 2011

Related U.S. Application Data

(63) Continuation of application No. PCT/JP2009/007107, filed on Dec. 22, 2009.

(30) Foreign Application Priority Data

Dec. 24, 2008  (JP) .................................. 2008-328451

(51) Int. Cl.
  *G06F 17/50* (2006.01)
  *H01L 25/00* (2006.01)
  *H03K 19/00* (2006.01)

(52) U.S. Cl. ........ 716/119; 716/129; 716/130; 716/134; 326/41; 326/47; 326/101

(58) Field of Classification Search .................. 716/119, 716/129, 130, 134; 326/41, 47, 101
  See application file for complete search history.

(56) References Cited

U.S. PATENT DOCUMENTS

| 5,164,811 | A |   | 11/1992 | Tamura | |
|---|---|---|---|---|---|
| 5,345,401 | A | * | 9/1994 | Tani ................................. | 703/16 |
| 5,619,418 | A | * | 4/1997 | Blaauw et al. ................ | 716/113 |
| 5,619,420 | A | * | 4/1997 | Breid ............................ | 716/113 |
| 5,689,432 | A | * | 11/1997 | Blaauw et al. ................ | 716/55 |
| 5,757,655 | A | * | 5/1998 | Shih et al. .................... | 716/102 |
| 5,956,497 | A | * | 9/1999 | Ratzel et al. ................. | 716/102 |
| 5,963,727 | A | * | 10/1999 | Shih et al. .................... | 716/102 |

(Continued)

FOREIGN PATENT DOCUMENTS

JP       02-287880       11/1990

(Continued)

OTHER PUBLICATIONS

Sutherland. I., et al., "Logical Effort: Designing Fast CMOS Circuits", 1999, Academic Press, pp. 1-17.

(Continued)

*Primary Examiner* — Phallaka Kik
(74) *Attorney, Agent, or Firm* — McDermott Will & Emery LLP

(57) ABSTRACT

A standard cell library is used in design of a semiconductor integrated circuit. A driving force sequence of cells for a single function is in the form of geometric progression with a geometric ratio of the "$p^{th}$ root of 2," where p is a natural number of 2 or more. A transistor in an output signal driving section of each of the cell is laid out using only layout devices which are limited to p types of sizes. Even if p is small, the driving force sequence can be formed in geometric progression with an extremely low increasing rate. At the same time, sizes of layout devices are discrete and limited, thereby easily securing accuracy of a performance model of a cell. As a result, the standard cell library allows a high-performance circuit to be designed in a highly reliable model.

3 Claims, 11 Drawing Sheets

U.S. PATENT DOCUMENTS

| | | | |
|---|---|---|---|
| 6,297,668 B1 * | 10/2001 | Schober | 326/101 |
| 6,324,671 B1 * | 11/2001 | Ratzel et al. | 716/103 |
| 6,643,828 B2 * | 11/2003 | Naffziger et al. | 716/112 |
| 6,842,045 B2 * | 1/2005 | Shimazaki et al. | 326/95 |
| 6,859,917 B2 * | 2/2005 | Shimazaki et al. | 716/103 |
| 7,003,738 B2 * | 2/2006 | Bhattacharya et al. | 716/102 |
| 7,080,341 B2 * | 7/2006 | Eisenstadt et al. | 326/81 |
| 7,185,294 B2 * | 2/2007 | Zhang | 716/55 |
| 7,426,710 B2 * | 9/2008 | Zhang et al. | 716/102 |
| 7,644,383 B2 * | 1/2010 | Bartling et al. | 716/115 |
| 8,015,517 B1 * | 9/2011 | Reis et al. | 716/103 |
| 8,214,787 B1 * | 7/2012 | Reis | 716/134 |
| 8,219,962 B1 * | 7/2012 | Anderson | 716/133 |
| 8,225,257 B2 * | 7/2012 | Tetelbaum | 716/113 |
| 2002/0053063 A1 * | 5/2002 | Bhattacharya et al. | 716/1 |
| 2003/0115560 A1 * | 6/2003 | Naffziger et al. | 716/5 |
| 2005/0278658 A1 * | 12/2005 | Zhang et al. | 716/1 |
| 2006/0064665 A1 * | 3/2006 | Zhang | 716/17 |
| 2006/0107239 A1 * | 5/2006 | Zhang et al. | 716/1 |
| 2007/0006109 A1 * | 1/2007 | Bartling et al. | 716/11 |
| 2009/0230988 A1 * | 9/2009 | Nieuwland et al. | 326/9 |
| 2010/0095260 A1 * | 4/2010 | Tetelbaum | 716/6 |

FOREIGN PATENT DOCUMENTS

| | | | |
|---|---|---|---|
| JP | 07311794 A | * | 11/1995 |
| JP | 09-022945 | | 1/1997 |
| JP | 09-107035 | | 4/1997 |
| JP | 2000188334 A | * | 7/2000 |
| JP | 2002-056042 | | 2/2002 |

OTHER PUBLICATIONS

Chinnery, D., et al., "Closing the Gap Between ASIC & Custom", Tools and Techniques for High-Performance ASIC Design, 2002, pp. 225-240.

* cited by examiner

FIG.1

$\theta = 2^{1/3} \quad (\quad \theta^3 = 2 \quad)$

『GEOMETRIC PROGRESSION DRIVING FORCE SEQUENCE WITH GEOMETRIC RATIO $\theta$ 』

| (-3) | (-2) | (-1) | (0) |
|---|---|---|---|
| X [1/2] | X [(1/2)$\theta$] | X [(1/2)$\theta^2$] | X [1] |
|  | (1) | (2) | (3) |
|  | X [$\theta$] | X [$\theta^2$] | X [2] |
|  | (4) | (5) | (6) |
|  | X [2$\theta$] | X [2$\theta^2$] | X [4] |
|  | (7) | (8) | (9) |
|  | X [4$\theta$] | X [4$\theta^2$] | X [8] |
|  | (10) | (11) | (12) |
|  | X [8$\theta$] | X [8$\theta^2$] | X [16] |
|  | (13) | (14) | (15) |
|  | X [16$\theta$] | X [16$\theta^2$] | X [32] |
|  | (16) | (17) | (18) |
|  | X [32$\theta$] | X [32$\theta^2$] | X [64] |
|  | ⋮ | ⋮ | ⋮ |
|  | 1 | 2 | 3 |

『TRANSISTOR LAYOUT DEVICE』

{X「(1/2)$\theta$」、X「(1/2)$\theta^2$」、X「1」}

FIG.2

$\theta = 2^{1/5}$  ($\theta^5 = 2$)

$\omega = 2^{2/5} = \theta^2$

『GEOMETRIC PROGRESSION DRIVING FORCE SEQUENCE WITH GEOMETRIC RATIO $\omega$』

|  |  | (-2) $X[(1/2)\theta]$ | (-1) $X[(1/2)\theta^3]$ | (0) $X[1]$ |
|---|---|---|---|---|
| (1) $X[\theta^2]$ | (2) $X[\theta^4]$ | (3) $X[2\theta]$ | (4) $X[2\theta^3]$ | (5) $X[4]$ |
| (6) $X[4\theta^2]$ | (7) $X[4\theta^4]$ | (8) $X[8\theta]$ | (9) $X[8\theta^3]$ | (10) $X[16]$ |
| (11) $X[16\theta^2]$ | (12) $X[16\theta^4]$ | (13) $X[32\theta]$ | (14) $X[32\theta^3]$ | (15) $X[64]$ |
| ⋮ | ⋮ | ⋮ | ⋮ | ⋮ |
| 11 | 12 | 13 | 14 | 15 |

『TRANSISTOR LAYOUT DEVICE』

{$X[(1/2)\theta]$, $X[(1/2)\theta^2]$, $X[(1/2)\theta^3]$, $X[(1/2)\theta^4]$, $X[1]$}

FIG.3

$\theta = 2^{1/5}$  ( $\theta^5 = 2$ )

〖DRIVING FORCE SEQUENCE 1 (GEOMETRIC RATIO $\omega_1 = 2^{2/5} = \theta^2$)〗

| | | (−2) $X_1[(1/2)\theta]$ | (−1) $X_1[(1/2)\theta^3]$ | (0) $X_1[1]$ |
|---|---|---|---|---|
| (1) $X_1[\theta^2]$ | (2) $X_1[\theta^4]$ | (3) $X_1[2\theta]$ | (4) $X_1[2\theta^3]$ | (5) $X_1[4]$ |
| (6) $X_1[4\theta^2]$ | (7) $X_1[4\theta^4]$ | (8) $X_1[8\theta]$ | (9) $X_1[8\theta^3]$ | (10) $X_1[16]$ |
| (11) $X_1[16\theta^2]$ | (12) $X_1[16\theta^4]$ | (13) $X_1[32\theta]$ | (14) $X_1[32\theta^3]$ | (15) $X_1[64]$ |
| ⋮ | ⋮ | ⋮ | ⋮ | ⋮ |
| 21 | 22 | 23 | 24 | 25 |

〖DRIVING FORCE SEQUENCE 2 (GEOMETRIC RATIO $\omega_2 = 2^{3/5} = \theta^3$)〗

| | | | (−1) $X_2[(1/2)\theta^2]$ | (0) $X_2[1]$ |
|---|---|---|---|---|
| (1) $X_2[\theta^3]$ | (2) $X_2[2\theta]$ | (3) $X_2[2\theta^4]$ | (4) $X_2[4\theta^2]$ | (5) $X_2[8]$ |
| (6) $X_2[8\theta^3]$ | (7) $X_2[16\theta]$ | (8) $X_2[16\theta^4]$ | (9) $X_2[32\theta^2]$ | (10) $X_2[64]$ |
| ⋮ | ⋮ | ⋮ | ⋮ | ⋮ |
| 31 | 32 | 33 | 34 | 35 |

〖TRANSISTOR LAYOUT DEVICE〗

{$X[(1/2)\theta]$, $X[(1/2)\theta^2]$, $X[(1/2)\theta^3]$, $X[(1/2)\theta^4]$, $X[1]$}

FIG.4

$\theta = 2^{1/3}$  ( $\theta^3 = 2$ )

『TRANSISTOR LAYOUT DEVICE』
 {X [ (1/2) $\theta$] , X [ (1/2) $\theta^2$] , X [1] }

『GEOMETRIC PROGRESSION DRIVING FORCE SEQUENCE WITH GEOMETRIC RATIO $\theta$ 』

|  | 1 | 2 | 3 |
|---|---|---|---|
|  | (−2) X [ (1/2) $\theta$] | (−1) X [ (1/2) $\theta^2$] | (0) X [1] |
| NUMBER OF LAYOUT DEVICES | 1 DEVICE | 1 DEVICE | 1 DEVICE |
|  | (1) X [$\theta$] | (2) X [$\theta^2$] | (3) X [2] |
| NUMBER OF LAYOUT DEVICES | 2 DEVICE | 2 DEVICE | 2 DEVICE |
|  | (4) X [2 $\theta$] | (5) X [2 $\theta^2$] | (6) X [4] |
| NUMBER OF LAYOUT DEVICES | 4 DEVICE | 4 DEVICE | 4 DEVICE |
|  | (7) X [4 $\theta$] | (8) X [4 $\theta^2$] | (9) X [8] |
| NUMBER OF LAYOUT DEVICES | 8 DEVICE | 8 DEVICE | 8 DEVICE |
|  | (10) X [8 $\theta$] | (11) X [8 $\theta^2$] | (12) X [16] |
| NUMBER OF LAYOUT DEVICES | 16 DEVICE | 16 DEVICE | 16 DEVICE |
|  | (13) X [16 $\theta$] | (14) X [16 $\theta^2$] | (15) X [32] |
| NUMBER OF LAYOUT DEVICES | 32 DEVICE | 32 DEVICE | 32 DEVICE |
|  | (16) X [32 $\theta$] | (17) X [32 $\theta^2$] | (18) X [64] |
| NUMBER OF LAYOUT DEVICES | 64 DEVICE | 64 DEVICE | 64 DEVICE |

FIG.5

$\theta = 2^{1/3} = 1.25992105...$  ($\theta^3 = 2.000$)

『TRANSISTOR LAYOUT DEVICE EXPRESSED BY NUMERICAL VALUES』
{X [0.630], X [0.794], X [1.000]}

『APPROXIMATION TO GEOMETRIC PROGRESSION DRIVING FORCE SEQUENCE WITH GEOMETRIC RATIO $\theta$ 』

| | (−2) | (−1) | (0) |
|---|---|---|---|
| NUMERICAL VALUE OF DRIVING FORCE | X [0.630] | X [0.794] | X [1.000] |
| APPROXIMATION AND ERROR | | | |
| NUMBER OF DEVICES IN APPROXIMATION AND RATE OF REDUCTION IN NUMBER | | | |
| | (1) | (2) | (3) |
| NUMERICAL VALUE OF DRIVING FORCE | X [1.260] | X [1.587] | X [2.000] |
| APPROXIMATION AND ERROR | | | |
| NUMBER OF DEVICES IN APPROXIMATION AND RATE OF REDUCTION IN NUMBER | | | |
| | (4) | (5) | (6) |
| NUMERICAL VALUE OF DRIVING FORCE | X [2.520] | X [3.175] | X [4.000] |
| APPROXIMATION AND ERROR | | | |
| NUMBER OF DEVICES IN APPROXIMATION AND RATE OF REDUCTION IN NUMBER | | | |
| | (7) | (8) | (9) |
| NUMERICAL VALUE OF DRIVING FORCE | X [5.040] | X [6.350] | X [8.000] |
| APPROXIMATION AND ERROR | 1.000x5 = 5.000 (−0.8%) | | |
| NUMBER OF DEVICES IN APPROXIMATION AND RATE OF REDUCTION IN NUMBER | 5/8 DEVICES(−37.5%) | | |
| | (10) | (11) | (12) |
| NUMERICAL VALUE OF DRIVING FORCE | X [10.079] | X [12.699] | X [16.000] |
| APPROXIMATION AND ERROR | 1.000x10 = 10.000 (−0.8%) | 1.000x12 + 0.630x1 = 12.630 (−0.5%) | |
| NUMBER OF DEVICES IN APPROXIMATION AND RATE OF REDUCTION IN NUMBER | 10/16 DEVICES(−37.5%) | 13/16 DEVICES(−18.7%) | |
| | (13) | (14) | (15) |
| NUMERICAL VALUE OF DRIVING FORCE | X [20.159] | X [25.398] | X [32.000] |
| APPROXIMATION AND ERROR | 1.000x19 + 0.630x2 = 20.260 (−0.5%) | 1.000x24 + 0.630x2 = 25.260 (−0.5%) | |
| NUMBER OF DEVICES IN APPROXIMATION AND RATE OF REDUCTION IN NUMBER | 21/32 DEVICES(−34.4%) | 26/32 DEVICES(−18.7%) | |
| | (16) | (17) | (18) |
| NUMERICAL VALUE OF DRIVING FORCE | X [40.317] | X [50.797] | X [64.000] |
| APPROXIMATION AND ERROR | 1.000x39 + 0.630x2 = 40.260 (−0.1%) | 1.000x50 + 0.794x1 = 50.794 (±0.0%) | |
| NUMBER OF DEVICES IN APPROXIMATION AND RATE OF REDUCTION IN NUMBER | 41/64 DEVICES(−35.9%) | 51/64 DEVICES(−20.3%) | |

FIG.6

$\theta = 2^{1/5}$    ($\theta^5 = 2$)

$\omega = 2^{2/5} = \theta^2$

『TRANSISTOR LAYOUT DEVICE』
{X[(1/2)θ]、X[(1/2)θ²]、X[(1/2)θ³]、X[(1/2)θ⁴]
、X[1]}

『GEOMETRIC PROGRESSION DRIVING FORCE SEQUENCE WITH GEOMETRIC RATIO ω』

| | | | | | |
|---|---|---|---|---|---|
| NUMBER OF LAYOUT DEVICES | | | (−2)<br>X[(1/2)θ]<br>1 DEVICE | (−1)<br>X[(1/2)θ³]<br>1 DEVICE | (0)<br>X[1]<br>1 DEVICE |
| NUMBER OF LAYOUT DEVICES | (1)<br>X[θ²]<br>2 DEVICE | (2)<br>X[θ⁴]<br>2 DEVICE | (3)<br>X[2θ]<br>4 DEVICE | (4)<br>X[2θ³]<br>4 DEVICE | (5)<br>X[4]<br>4 DEVICE |
| NUMBER OF LAYOUT DEVICES | (6)<br>X[4θ²]<br>8 DEVICE | (7)<br>X[4θ⁴]<br>8 DEVICE | (8)<br>X[8θ]<br>16 DEVICE | (9)<br>X[8θ³]<br>16 DEVICE | (10)<br>X[16]<br>16 DEVICE |
| NUMBER OF LAYOUT DEVICES | (11)<br>X[16θ²]<br>32 DEVICE | (12)<br>X[16θ⁴]<br>32 DEVICE | (13)<br>X[32θ]<br>64 DEVICE | (14)<br>X[32θ³]<br>64 DEVICE | (15)<br>X[64]<br>64 DEVICE |
| | 11 | 12 | 13 | 14 | 15 |

FIG.7

$\theta = 2^{1/5} = 1.148698355...$  ($\theta^5 = 2.000$)

$\omega = 2^{2/5} = \theta^2 = 1.319507911...$  ($\omega^5 = 4.000$)

〚TRANSISTOR LAYOUT DEVICE EXPRESSED BY NUMERICAL VALUES〛

{X [0.574], X [0.660], X [0.758], X [0.871], X [1.000]}

〚APPROXIMATION TO GEOMETRIC PROGRESSION DRIVING FORCE SEQUENCE WITH OMETRIC RATIO $\omega$〛

| | (−2) | (−1) | (0) |
|---|---|---|---|
| NUMERICAL VALUE OF DRIVING FORCE | X [0.574] | X [0.758] | X [1.000] |
| APPROXIMATION AND ERROR | / | / | / |
| NUMBER OF DEVICES IN APPROXIMATION AND RATE OF REDUCTION IN NUMBER | / | / | / |

| | (1) | (2) | (3) | (4) | (5) |
|---|---|---|---|---|---|
| NUMERICAL VALUE OF DRIVING FORCE | X [1.320] | X [1.714] | X [2.297] | X [3.031] | X [4.000] |
| APPROXIMATION AND ERROR | / | / | / | / | / |
| NUMBER OF DEVICES IN APPROXIMATION AND RATE OF REDUCTION IN NUMBER | / | / | / | / | / |

| | (6) | (7) | (8) | (9) | (10) |
|---|---|---|---|---|---|
| NUMERICAL VALUE OF DRIVING FORCE | X [5.278] | X [6.964] | X [9.190] | X [12.126] | X [16.000] |
| APPROXIMATION AND ERROR | 1.000x4 + 0.660x2 = 5.320 (+0.8%) | 1.000x7 = 7.000 (+0.5%) | 1.000x8 + 0.574x2 = 9.149 (−0.4%) | 1.000x11 + 0.574x2 = 12.149 (+0.2%) | / |
| NUMBER OF DEVICES IN APPROXIMATION AND RATE OF REDUCTION IN NUMBER | 6/8 DEVICES (−25.0%) | 7/8 DEVICES (−12.5%) | 10/16 DEVICES (−37.5%) | 13/16 DEVICES (−18.75%) | / |

| | (11) | (12) | (13) | (14) | (15) |
|---|---|---|---|---|---|
| NUMERICAL VALUE OF DRIVING FORCE | X [21.112] | X [27.858] | X [36.758] | X [48.503] | X [64.000] |
| APPROXIMATION AND ERROR | 1.000x20 + 0.574x2 = 21.149 (+0.2%) | 1.000x27 + 0.871x1 = 27.871 (+0.05%) | 1.000x36 + 0.758x1 = 36.758 (±0.0%) | 1.000x46 + 0.758x2 = 48.516 (+0.03%) | / |
| NUMBER OF DEVICES IN APPROXIMATION AND RATE OF REDUCTION IN NUMBER | 22/32 DEVICES (−31.25%) | 28/32 DEVICES (−12.5%) | 37/64 DEVICES (−42.2%) | 48/64 DEVICES (−23.4%) | / |

$\theta = 2^{1/3}$   ( $\theta^3 = 2$ )

$\theta = 2^{1/3}$  ($\theta^3 = 2$)

FIG.11

$\theta = 2^{1/5}$ ( $\theta^5 = 2$ )

『DRIVING FORCE SEQUENCE』

|  |  | ⟨1⟩ $X[(1/2)\theta]$ | ⟨2⟩ $X[(1/2)\theta^3]$ | ⟨3⟩ $X[1]$ |
|---|---|---|---|---|
| ⟨4⟩ $X[\theta^2]$ | ⟨5⟩ $X[\theta^4]$ | ⟨6⟩ $X[2\theta]$ | ⟨7⟩ $X[2\theta^3]$ | ⟨8⟩ $X[4]$ |
| ⟨9⟩ $X[4\theta^2]$ | ⟨10⟩ $X[8]$ | ⟨11⟩ $X[8\theta^3]$ | ⟨12⟩ $X[16\theta]$ | ⟨13⟩ $X[16\theta^4]$ |
| ⟨14⟩ $X[32\theta^2]$ | ⟨15⟩ $X[64]$ |  |  |  |

『TRANSISTOR LAYOUT DEVICE』

{ $X[(1/2)\theta]$ , $X[(1/2)\theta^2]$ , $X[(1/2)\theta^3]$ , $X[(1/2)\theta^4]$ , $X[1]$ }

STANDARD CELL LIBRARY AND SEMICONDUCTOR INTEGRATED CIRCUIT

CROSS-REFERENCE TO RELATED APPLICATION

This is a continuation of PCT International Application PCT/JP2009/007107 filed on Dec. 22, 2009, which claims priority to Japanese Patent Application No. 2008-328451 filed on Dec. 24, 2008. The disclosures of these applications including the specifications, the drawings, and the claims are hereby incorporated by reference in their entirety.

BACKGROUND

The present disclosure relates to standard cell libraries used in design of semiconductor integrated circuits, and more particularly to formation of driving force sequences of libraries and cell layout configurations implementing the driving force sequences. Specifically, the present disclosure relates to standard cell libraries including geometric progression driving force sequences.

In design of a semiconductor integrated circuit, a standard cell library used as an ASIC design method includes some functions which are limited to basic logic functions such as an inverter, a buffer, a two-input NAND, a two-input NOR, a two-input AND, and a two-input OR. A transistor circuit performs a logic function in the form of a logic gate, which is registered as a standard cell. Cells with different driving force can be formed for each logic function by changing the sizes of transistors for driving output signals. In general, cells with a plurality of types of driving force are registered for a single logic function.

On the other hand, as a custom design method for designing a high-performance circuit, there exists the idea of limiting logic functions to basic ones to some extent, treating the functions as logic gates, and combining the logic gates to design the circuit. Such a method is suggested in, for example, Ivan Sutherland, Bob Sproull, and David Harris, Logical Effort: Designing Fast CMOS Circuits, Academic Press, 1999. Sutherland et al. use a custom design method, in which transistor sizes of gates are manually set to optimum sizes in a serial manner, each time when the transistors are provided in a circuit. Sutherland et al. describes as a basic design guideline that driving force of logic gates arranged in a continuous logical path is preferably geometrically increased from an input to an output of a path signal. This is widely known among custom designers as a guideline supported by a logical background and authors' accumulated experiences.

Conventionally, in a standard cell library, if reference driving force is [1], a driving force sequence of cells having the same logic function geometrically increases by two times like [½], [1], [2], [4], and [8]. Then, with an increasing demand for using an ASIC design method to a high-speed circuit design, higher driving force such as [16] and [32] is added, thereby extending a driving force sequence at the side of the higher driving force. Furthermore, with an increasing demand for low power consumption, it became known that the increasing rate of the driving force is preferably low to reduce cases using excessively great driving force, and thus intermediate driving force such as [3] and [6] is added. As a result, the driving force levels are [½], [1], [2], [3], [4], [6], [8], [16], and [32]. The increasing rates between the adjacent driving force levels are non-uniform, since rates 1.5 and 1.333 are included in addition to 2.0. Compared to the past, driving force sequences with greater variety of driving force are becoming common.

In recent years, the industry of designing a semiconductor large-scale integrated circuit has particularly strongly demanded for an improvement in a semi-custom design method, i.e., an ASIC design method using a standard cell library, so that the semi-custom design method is used in higher-performance circuit design which requires both of high speed and low power consumption in a high level. To achieve the objective, for example, David Chinnery and Kurt Keutzer, Closing the Gap Between ASIC & Custom, Kluwer Academic Publishers, 2002 provides some suggestions to actively introduce the idea of the custom design method into the ASIC design method.

Chinnery et al. focus on size design of a transistor as a possible improvement method which is left in design of a standard cell library. For example, Chinnery et al. suggest the process flow of: taking a usual ASIC design procedure using a standard cell library; and then, receiving delay analysis, selecting a cell of which speed needs to be increased to meet delay constraints, or a cell consuming excessive power at excessively high speed with respect to the delay constraints; and correcting an internal transistor size to use the selected cell in the design as a new cell. Chinnery et al. also report that this flow reduces circuit delay by 13.5% and power consumption by 18%. This example also shows the great importance and the advantage of strictly controlling the sizes of individual transistors in a cell in view of optimizing a standard cell library to design a high-performance circuit.

According to the suggested flow, since the size of the cell itself may change when correcting the sizes of the transistors within the cell, there is an inevitable problem of increasing excessive work of adding and redesigning new cells. To address this problem, for example, Japanese Patent Publication No. H09-107035 suggests a definition method of a library in which sizes of internal transistors can be freely redesigned under predetermined maximum size constraints, without changing the size of the cell or positions of input/output pins of the cell.

SUMMARY

With increasing miniaturization of transistors, it is becoming difficult to complete gate length (effective channel length) and effective channel width as intended by a designer in a manufacturing process. A non-negligible problem is that STI stress changes electrical characteristics of a channel. Influences of these problems on performance of a transistor partially depend on the size of the transistor itself, and may depend on complex causes such as a positional relation with other transistors provided in the vicinity. It is thus difficult to precisely estimate the influences and to model a transistor. A suggested method is analyzing in advance, electrical characteristics of transistors when laying out the transistors in a cell using a test element group (TEG), and reflecting the analysis to the model used in design. However, in general, it is extremely difficult to analyze all layout variations in advance including variation of transistor sizes and positional relation between adjacent transistors, since there are a large number of patterns.

The method of reviewing size design of a transistor in a cell as appropriate in a design flow, which has been described above as a conventional technique, eventually improves flexibility in the size design of the transistor. This clearly provides advantages in performance obtained in a custom design method. However, since sizes of transistors to be used cannot be specified in advance, there is at least a disadvantage that transistors are inevitably designed using a model with a great margin of error, as a performance model of a transistor in the generation of miniaturized transistors.

It is an objective of the present disclosure to reduce the problem of miniaturized transistors that accuracy of a model is difficult to ensure by limiting sizes of the transistors used in a cell to reduce the number of layout patterns analyzed by a TEG to a practical level; and to provide a standard cell library including a driving force sequence suited for high-level design, i.e., a geometric driving force sequence with a low increasing rate.

In order to achieve the objective, the present disclosure mainly has the configuration described below.

Specifically, a standard cell library of the present disclosure is used in design of a semiconductor integrated circuit. The standard cell library includes a plurality of cells for performing at least one cell function. For the at least one cell function, a cell group of some of the plurality of cells having the same cell function and different driving force is included. A sequence of the driving force of the cell group forms geometric progression with respect to an index of driving force which is a relative size of a transistor size in an output signal driving section of each of the plurality of cells belonging to the cell group. P is a natural number of two or more. The geometric progression has a geometric ratio substantially expressed by the "$p^{th}$ root of two" (i.e., $2^{1/p}$).

In the standard cell library of the present disclosure, with respect to the transistor size in the output signal driving section of each of the plurality of cells, a specific size of a transistor layout device provided in a cell as a single device is defined as reference size X[1]. $\theta^p$ is 2, where a positive real number $\theta$ is defined by $2^{1/p}$ with the natural number p. P types of transistor layout devices distinguished by p types of sizes expressed by $X[(\frac{1}{2}) \cdot \theta_S]$ based on the reference size X[1], where s is a natural number ranging from 1 to p, are mounted as devices included in a transistor of the output signal driving section. A first cell belongs to the cell group. When the transistor size in the output signal driving section is equal to or greater than $X[(\frac{1}{2}) \cdot \theta]$ based on the reference size X[1], the transistor in the output signal driving section of the first cell is laid out within the first cell by (repeatedly) placing one or multiple ones of a transistor layout device selected from the p types of transistor layout devices in accordance with the first cell.

In the standard cell library, since the geometric progression has the geometric ratio of the "$p^{th}$ root of 2," where p is a natural number of 2 or more, a miniaturized driving force sequence suited for high-level design with an extremely low increasing rate can be formed, even when the p is a small number such as about 5. In addition, sizes of transistors required as layout devices for implementing the driving force sequence can be reduced to the p types. The types of the layout devices for transistors in the output signal driving section are not continuous and variable but are discrete and limited. This easily ensures accuracy of a model of the transistor, and provides a standard cell library for high-level design based on a performance model with less error.

In the standard cell library of the present disclosure, with respect to the transistor size in the output signal driving section of each of the plurality of cells, a specific size of a transistor layout device provided in a cell as a single device is defined as reference size X[1]. $\theta^p$ is 2, where a positive real number $\theta$ is defined by $2^{1/p}$ with the natural number p. P types of transistor layout devices distinguished by p types of sizes expressed by $X[(\frac{1}{2}) \cdot \theta^S]$ based on the reference size X[1], where s is a natural number ranging from 1 to p, are mounted as devices included in a transistor of the output signal driving section. A first cell belongs to the cell group. When the transistor size in the output signal driving section is equal to or greater than $X[(\frac{1}{2}) \cdot \theta]$ based on the reference size X[1], the transistor in the output signal driving section of the first cell is laid out within the first cell by combining and arranging the p types of transistor layout devices.

In the standard cell library, when the geometric progression driving force sequence with a low increasing rate is implemented by the discrete and limited layout devices, a slight error in driving force is accepted, and the driving force is approximately implemented by combining layout devices with different sizes. This significantly reduces the number of layout devices arranged in parallel. Since the cell width for the reduced devices arranged in parallel can be reduced, the cell area can be significantly reduced without substantially changing the driving force.

Furthermore, a standard cell library of the present disclosure is used in design of a semiconductor integrated circuit. The standard cell library includes a plurality of cells for performing at least one cell function. For the at least one cell function, a cell group of some of the plurality of cells having the same cell function and different driving force is included. A sequence of the driving force of the cell group forms geometric progression with respect to an index of driving force which is a relative size of a transistor size in an output signal driving section of each of the plurality of cells belonging to the cell group. P is a natural number of two or more, and q is a natural number of 1 or more and less than p. The geometric progression has a geometric ratio substantially expressed by the "$q^{th}$ power of the $p^{th}$ root of 2" ($2^{q/p}$).

In the standard cell library of the present disclosure, with respect to the transistor size in the output signal driving section of each of the plurality of cells, a specific size of a transistor layout device provided in a cell as a single device is defined as reference size X[1]. $\theta^p$ is 2, where a positive real number $\theta$ is defined by $2^{1/p}$ with the natural number p. P types of transistor layout devices distinguished by p types of sizes expressed by $X[(\frac{1}{2}) \cdot \theta^s]$ based on the reference size X[1], where s is a natural number ranging from 1 to p, are mounted as devices included in a transistor of the output signal driving section. A first cell belongs to the cell group. When the transistor size in the output signal driving section is equal to or greater than $X[(\frac{1}{2}) \cdot \theta]$ based on the reference size X[1], the transistor in the output signal driving section of the cell is laid out within the first cell by (repeatedly) placing one or multiple ones of a transistor layout device selected from the p types of transistor layout devices in accordance with the first cell.

In the present disclosure, the geometric ratio of the geometric progression formed by the driving force sequence can be expanded to the "$q^{th}$ power of the $p^{th}$ root of 2," where p is a natural number of 2 or more, and q is a natural number of 1 or more and less than p. In addition, sizes of transistors required as layout devices for implementing the driving force sequence can be reduced to the p types. This expands the alternative of the geometric ratios, thereby improving optimization of the standard cell library.

In addition, a standard cell library of the present disclosure is used in design of a semiconductor integrated circuit. The standard cell library includes a plurality of cells for performing a plurality of cell functions. For a first cell function, a first cell group of a plurality of cells having the same cell function and different driving force are included. For a second cell function different from the first cell function, a second cell group of a plurality of cells having the same cell function and different driving force is included. A transistor size in an output signal driving section of each of the cells belonging to the first cell group and the second cell group is defined by a common reference size. Driving force of the first cell function is defined by, as an index, a ratio of the transistor size in the output signal driving section of each of the cells belonging to the first cell group to the reference size. A sequence of the driving force of the first cell group forms first geometric progression. P is a natural number of two or more, and q is a natural number of 1 or more and less than p. The first geometric progression has a geometric ratio substantially expressed by the "$q^{th}$ power of the $p^{th}$ root of 2" ($2^{q/p}$). Driving force of the second cell function is defined by, as an index, a ratio of the transistor size in the output signal driving section of each of the cells belonging to the second cell group to the reference size. A sequence of the driving force of the second cell group forms second geometric progression. R is a natural number more than q and less than p. The second geometric progression has a geometric ratio substantially expressed by the "$r^{th}$ power of the $p^{th}$ root of 2" ($2^{r/p}$).

In the standard cell library of the present disclosure, with respect to the transistor size in the output signal driving section of each of the plurality of cells, a specific size of a transistor layout device provided in each of the cells belonging to the first cell group and the second cell group as a single device is defined as common reference size X[1]. $\theta^p$ is 2, where a positive real number $\theta$ is defined by $2^{1/p}$ with the natural number p. P types of transistor layout devices distinguished by p types of sizes expressed by X[(½)·$\theta^s$] based on the reference size X[1], where s is a natural number ranging from 1 to p, are mounted as devices included in a transistor of the output signal driving section. A first cell belongs to the first or second cell group. When the transistor size in the output signal driving section is equal to or greater than X[(½)·$\theta$] based on the reference size X[1], the transistor in the output signal driving section of the first cell is laid out within the first cell by (repeatedly) placing one or multiple ones of a transistor layout device selected from the p types of transistor layout devices in accordance with the first cell.

In the standard cell library, when for example, driving force sequences for two cell functions of a cell function A and a cell function B are given, and cells are designed with a same p/n ratio, geometric ratios are selected from the form of the "power of the $p^{th}$ root of two," thereby implementing the both driving force sequences using common p types of layout devices. That is, miniaturized geometric progression driving force sequences with the different geometric ratios can be implemented by the common discrete and limited layout devices.

As described above, the standard cell library of the present disclosure provides a geometric driving force sequence with a low increasing rate. Thus, driving force which is similar to that of a custom design method and required in high-speed, low power consumption, and high-performance circuit design can be selected as a library in the form close to the custom design method.

At the same time, the types of the layout devices for transistors in the output signal driving section, which are most important in ensuring accuracy of a performance model of the cell, are not continuous and variable but are discrete and limited. This easily ensures accuracy of a model of the transistor, and provides a standard cell library for high-level design based on a performance model with less error. Therefore, the present disclosure provides a standard cell library in which a high-performance circuit is designed with a highly reliable model.

BRIEF DESCRIPTION OF THE DRAWINGS

FIG. 1 illustrates a driving force sequence and layout devices in a standard cell library according to a first embodiment of the present disclosure.

FIG. 2 illustrates a driving force sequence and layout devices in a standard cell library according to a second embodiment of the present disclosure.

FIG. 3 illustrates a driving force sequence and layout devices in a standard cell library according to a third embodiment of the present disclosure.

FIG. 4 illustrates a driving force sequence and layout devices in a standard cell library according to a first example of a fourth embodiment of the present disclosure, and is strictly expressed by $\theta$.

FIG. 5 illustrates a driving force sequence and layout devices in a standard cell library according to the first example of the fourth embodiment, and is expressed by numerical values.

FIG. 6 illustrates a driving force sequence and layout devices in a standard cell library according to a second example of the fourth embodiment, and is strictly expressed by $\theta$.

FIG. 7 illustrates a driving force sequence and layout devices in a standard cell library according to the second example of the fourth embodiment, and is expressed by numerical values.

FIG. 11 illustrates an example driving force sequence for a single cell function in which a geometric progression driving force sequence has the geometric ratio of $\theta^2$ where driving force is small, and the geometric ratio of $\theta^3$ where driving force is great.

DETAILED DESCRIPTION

Figure 8:
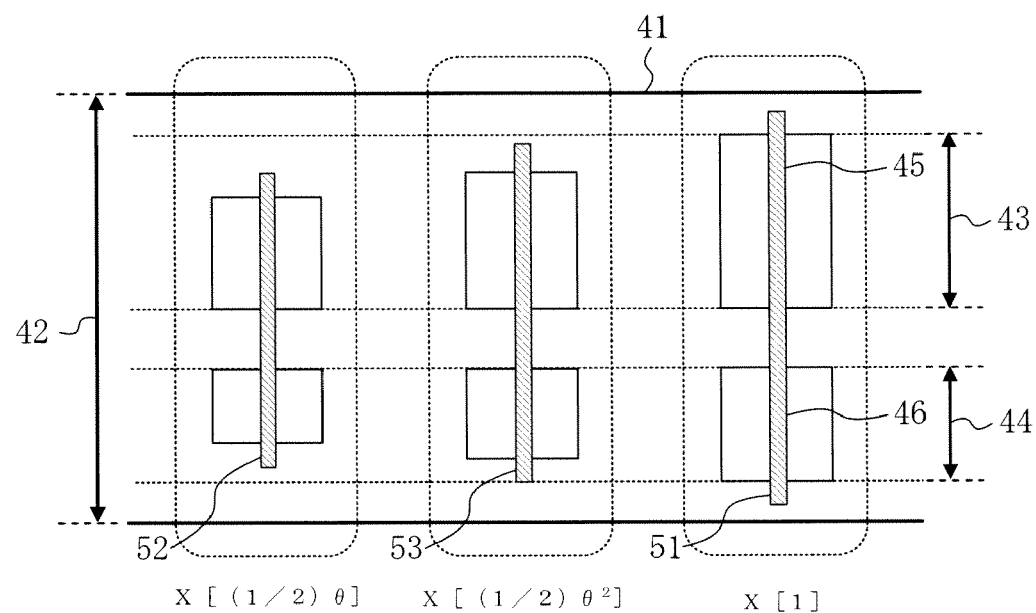
FIG. 8 illustrates three types of layout devices for implementing a driving force sequence of an INV cell in the form of geometric progression with the geometric ratio of the third root of two.

A standard cell library including a geometric progression driving force sequence according to an embodiment of the present disclosure will be described below.

In the specification, an individual MOS transistor device in a layout of a standard cell is referred to as a "transistor layout device" or simply, a "layout device." Transistor layout devices are counted as "one device," "two devices," etc. The transistor layout devices include two types of p-channel transistor layout devices (PMOS transistor devices) and n-channel transistor layout devices (NMOS transistor devices). When a single p-channel transistor layout device and a single n-channel transistor layout device are considered as a CMOS transistor device pair, the pair may be referred to as a "transistor layout device," or simply, a "layout device." On the other hand, transistors on a circuit are simply referred to as "p-channel transistors" or "n-channel transistors." When a p-channel transistor and an n-channel transistor are considered as a CMOS transistor pair, the pair may be referred to as a "transistor."

A "size of a layout device" represents a channel width. The specification focuses on a transistor in a part driving an output signal of a standard cell. All transistor layout devices have the same channel length in the standard cell library. When a single p-channel transistor layout device and a single n-channel transistor layout device are considered as a CMOS transistor device pair, a pair of the channel widths of the p-type and n-type layout devices are referred to as a "size of a layout device."

When the size, i.e., the channel width of a layout device is expressed by nanometer (nm), the value largely varies depending on which generation of a fine processing technique is used to manufacture the device. The height of the standard cell varies depending on the generation of the fine processing technique or the type of a semiconductor integrated circuit to be designed. In this respect, as well, the nanometer value indicating the size of the layout device to be mounted also largely varies. Since the specification focuses on a relative size in a single library of the standard cell, a reference size is defined to discuss sizes according to the ratio to the reference size. The reference size will be described below in detail.

The present disclosure does not depend on a particular layout configuration of a standard cell. As a general layout configuration of a standard cell, a p-channel transistor layout device and an n-channel transistor layout device are arranged so that the channel width direction is parallel to the direction of a cell height. The region for the p-channel transistor layout device and the region for the n-channel transistor layout device are separated in the cell to divide the cell height. The size of a layout device provided in the cell as a single device includes the maximum sizes of the p-channel and n-channel types. The maximum size is common among the all cells belonging to a single standard cell library.

Relating to driving force of a cell, the present disclosure focuses on a transistor in an output signal driving section of the cell. While a "transistor in an output signal driving section" in the specification does not differ from what is generally recognized, an example will be provided using a typical cell circuit. First, in a cell of an inverter circuit, a single signal is input to the cell. There is a pair of a p-channel transistor and an n-channel transistor of which gate electrodes are directly controlled with the signal. Since the pair is a CMOS transistor pair driving an output signal, and is thus considered as the "transistor in an output signal driving section." Next, in a cell of a buffer circuit, since inverter circuits are coupled in two stages, a transistor included in the inverter circuit in the later stage is considered as the "transistor in an output signal driving section." In a cell of a two-input NAND circuit, if two input signals are referred to as a "signal A" and a "signal B," there are a pair of a p-channel transistor and an n-channel transistor (hereinafter referred to as a "transistor pair A") of which gate electrodes are directly controlled with the signal A, and a pair of a p-channel transistor and an n-channel transistor (hereinafter referred to as a "transistor pair B") of which gate electrodes are directly controlled with the signal B. The p-channel transistor of the transistor pair A and the p-channel transistor of the transistor pair B pull up the output signal with parallel connection of channels. The n-channel transistor of the transistor pair A and the n-channel transistor of the transistor pair B pull down the output signal by series connection of channels. In the specification, each of the transistor pair A and the transistor pair B is considered as a transistor in the output signal driving section of a 2NAND. Note that in the assumed 2NAND, the pair A is the same as the pair B as a CMOS transistor pair. When discussing the attribute of the transistor in the output signal driving section, either one of the transistor pairs is used as the representative. This is applicable to the 2NOR circuit.

Cells included in a standard cell library are classified by cell functions. In general, a plurality of cells having cell functions are prepared. Cell functions are, for example, an inverter, a buffer, a two-input NAND, a two-input NOR, a two-input AND, a two-input OR, etc. For each cell function, there exist a plurality of cells with different output signal driving force. In a circuit of a cell, a transistor in a part of driving an output signal is formed by a combination of a p-channel transistor and an n-channel transistor. The size of each of the channel types of transistors is equal to the sum of the sizes of the both channel types of transistor layout devices provided independently or in parallel in the layout of the cell to form the both types of channel transistors. In the specification, the size of the transistor in the output signal driving section is represented by a pair of the sizes of the p-channel transistor and the n-channel transistor. On that basis, the output signal driving force of a cell, i.e., the driving force of the cell is indicated by a size of the transistor in the output signal driving section. Now the size of the transistor itself of the output signal driving section used as an index for quantifying the driving force of the cell is defined as a pair of the sizes of p-channel and n-channel transistors, the driving force can be represented by a pair of numerical values. Therefore, it is difficult to discuss the magnitude relation between the driving force levels of preferred two cells. The magnitude relation of the driving force needs to be discussed on the assumption that the compared cells meet predetermined conditions. This point will be described below.

In general, a cell group having the same cell function in a single standard cell library has a constant ratio of the size of a p-channel transistor to the size of an n-channel transistor forming the output signal driving section. This ratio will be referred to as a "p/n ratio of a transistor in an output signal driving section," and will be simply referred to as a "p/n ratio of a cell" in the specification. Since p/n ratios of cells are optimized depending on the cell functions, the cells have generally different p/n ratios when the cell functions are different. The specification requires as a necessary condition that pin ratios of two cells be equal when discussing the magnitude relation or the ratios between the driving force levels of the two cells. In a circuit of a cell, for example, a NAND cell in which p-channel transistors drive an output with parallel connection of channels, and n-channel transistors drive the output with series connection of channels; even if the p/n ratio of the NAND cell is equal to that in an inverter cell, the driving force of the NAND cell and the inverter cell needs to be considered different in quality. Thus, the magnitude cannot be directly compared. Therefore, it is a necessary condition but not a sufficient condition that the p/n ratios are equal for the magnitude comparison of the driving force. In other words, note that magnitude of driving force can be compared only when cell functions are the same.

As will be described below, the specification focuses on the point that magnitude comparison and ratios between transistor sizes in output signal driving sections of two cells can be discussed under the condition where the p/n ratios are equal. With respect to the driving force of a cell, magnitude comparison and ratios between two driving force levels can be discussed based on magnitude comparison between transistor sizes in an output signal driving section where the p/n ratios are equal, only when cell functions are the same. When a cell function is assigned, it is convenient to prepare a single driving force level as a reference according to the cell function to discuss the magnitude relation of the driving force among numerous cells having the same cell function. In order to define the reference driving force, a reference size of a transistor size is introduced to indicate a p/n ratio according to the cell function.

Now the p/n ratio of a cell is considered to be fixed. The specification focuses on a maximum size transistor implemented by a pair of a single p-channel transistor layout device and a single n-channel transistor layout device in the layout of the cell, while satisfying a given p/n ratio. The transistor size is referred to as the reference size according to the p/n ratio. Therefore, the "reference size" in the specification is, in the layout of the cell, a pair of a specific size of a p-channel transistor layout device provided independently (as a single device) in the cell, and a specific size of an n-channel transistor layout device provided independently (as a single device) in the cell. The pair satisfies the given p/n ratio. The reference size will be expressed by X[1] in the following description. When the p/n ratios are equal, all the transistor sizes can be relatively expressed with the reference size. For example, in a transistor of an output signal driving section in which the sizes of a p-channel and n-channel transistors are both half of the reference size, the relative sizes of the transistors are expressed by X[½]. On the contrary, where the sizes of the p-channel and n-channel transistors are twice of the reference size, the relative sizes of the transistors are X[2].

Then, a cell function is considered to be fixed. When a single cell function is given, the p/n ratio is determined accordingly. Thus, the reference size may be a reference size according to the cell function. In cells having the same cell function, a relative size of a transistor size in an output signal driving section, which is expressed by the ratio to the reference size according to the cell function, may be used as an index of driving force to discuss the magnitude relation and the ratio of the driving force. The driving force of a cell including a transistor with the reference size X[1] in an output signal driving section is defined as and expressed by reference driving force X [1]. For example, assume that a cell A and a cell B have the same cell function. Using preferred positive real numbers a and b, when the size of the transistor of in output signal driving section of the cell A is X[a], the driving force of the cell A can be expressed by X[a] which means a times as great as the reference driving force. Similarly, when the size of the transistor of in output signal driving section in the cell B is X[b], the driving force of the cell B is expressed by X[b]. The ratio of the driving force of the cell B to the driving force of the cell A can be expressed by b/a.

At the end of the explanation of the reference size, expressing the size of a transistor layout device based on the reference size X[1] is considered. The reference size X[1] can be defined by fixing the p/n ratio of the cell. Thus, the size of a transistor layout device can be also expressed by a relative size in accordance with the ratio using the reference size X[1] according to the p/n ratio as long as a pair satisfying the same p/n ratio is focused on. If the relative size of a layout device is X[c], where c is a preferred positive real number, note that c is less than 1 from the definition of the reference size. Conversely, where the relative size of a transistor is X[c] and c is less than 1, the X[c] can be construed as expressing the relative size of a single transistor layout device.

First Embodiment

First embodiment of the present disclosure will be described below.

In this embodiment, one cell function is fixed, and thus, the p/n ratio of a cell is considered to be fixed. Assume that the reference size of a transistor according to the given p/n ratio is X[1], and that the driving force of the cell including a transistor with the reference size X[1] as a transistor in an output signal driving section is reference driving force X[1].

As described above, the size of a transistor in an output signal driving section of a cell according to the p/n ratio is expressed by X[a] where the reference size is a times as large as X, where a is a positive real number, in accordance with the ratio to the reference size. The driving force at that time is driving force X[a] which means a times as large as the reference driving force. The specification often uses the expression "driving force sequence." The "driving force sequence" means sequential arrangement of cells from a cell with the smallest driving force to a cell with the greatest driving force in accordance with the driving force indexes expressed by X[•] when a cell group of cells sharing a single cell function is focused on and a single cell corresponds to a single driving force level. In the specification, when a plurality of cells sharing the cell function and having different driving force need to be prepared to develop a single standard cell library, the plurality of cells are designed in a driving force sequence so that the driving force of the cells forms geometric progression with the geometric ratio of a "root of two." This discretely limits the sizes of layout devices, thereby enabling miniaturization of the driving force sequence and securing design reliability.

Where p is a natural number of 2 or more, the positive real number θ is obtained by the following expression.

$$\theta = 2^{1/p} \qquad (1)$$

That is, θ is the "$p^{th}$ root of 2," and thus, the following equation is obtained.

$$\theta^p = 2 \qquad (1')$$

An example will be described where a driving force sequence is provided in the form of geometric progression with the geometric ratio of θ. First, assume that X[1] itself, which is reference driving force, is included in the sequence. At this time, the driving force sequence equal to or smaller than X[1] is expressed as follows, if X[½] is the minimum driving force.

$$X[½], X[(½)\theta], X[(½)\theta^2], \ldots, X[(½)\theta^{p-1}], X[1] \qquad (2)$$

With respect to the driving force greater than X[1], the driving force sequence is expressed as follows.

$$X[\theta], X[\theta_2], \ldots, X[\theta^{p-1}], X[2],$$

$$X[2\theta], X[2\theta^2], \ldots, X[2\theta^{p-1}], X[4],$$

$$X[4\theta], X[4\theta^2], \ldots, X[4\theta^{p-1}], X[8] \qquad (3)$$

In the sequence (3), for example, the driving force X[θ] is as twice as great as driving force X[(½)θ]. That is, while a transistor with size X[θ] may be used to form a cell with driving force X[θ], the cell may be formed by connecting in parallel, two transistors having a size X[(½)θ] and producing driving force X[(½)θ]. Similarly, for example, since driving force X[2θ²] is as four times as great as driving force X[(½)θ²], a cell with the driving force X[2θ²] may be formed by connecting in parallel, four transistors having size X[(½)θ²] and producing driving force X[(½)θ²]. From this point of view, in the sequence (3), no matter how great the driving force is, all the driving force can be implemented by connecting in parallel transistors with the following p types of sizes.

Set of Transistor Sizes:

$$\{X[(½) \cdot \theta^s], \text{ where s is a natural number ranging from 1 to p}\} \qquad (4)$$

Furthermore, with respect to p+1 types of driving force in the sequence (2), driving force of all the p types except for the minimum driving force X[½] clearly corresponds to p types of sizes in the set (4) one to one. Since the transistor sizes in the set (4) are equal to or smaller than X[1], all these sizes are construed as the sizes of transistor layout devices. That is, if a driving force sequence is provided in the form of geometric progression with the geometric ratio of the θ (i.e., the $p^{th}$ root of 2), all the driving force equal to or greater than X[(½)θ] can be implemented only by transistor layout devices having p types of sizes represented by the following set (5).

Set of Sizes of Transistor Layout Devices:

$$\{X[(1/2) \cdot \theta^s], \text{ where s is a natural number ranging from 1 to p}\} \quad (5)$$

Now, an example will be specifically described where the natural number p is 3.

At this time, the positive real number $\theta$ is defined by $2^{1/3}$ to be $\theta^3=2$. While noting this, the table "GEOMETRIC PROGRESSION DRIVING FORCE SEQUENCE WITH GEOMETRIC RATIO $\theta$" in FIG. 1 illustrates a geometric progression driving force sequence with the geometric ratio $\theta$. In the table, the numbers such as (1) above $X[\theta]$ and (3) above $X[2]$ are the values of power where the ratio of the driving force to the reference driving force $X[1]$ is expressed by the power $\theta$. For convenience of explanation, the values of power are used as indexes of driving force. For example, $X[\theta]$ is the "$(1)^{st}$ driving force," $X[2]$ is the "$(3)^{rd}$ driving force," and $X[(1/2) \cdot \theta]$ is the "$(-2)^{nd}$ driving force." At this time, where the minimum driving force is $X[1/2]$ and the maximum driving force is $X[64]$ in the driving force sequence, indexes are given from index (−3) to index (18) in the order of increasing one by one. In the table, the driving force of $X[(1/2)\theta]$ or more, i.e., the driving force with indexes of (−2) or more is divided into three groups by classifying the indexes by residues of 3 (i.e., p). Reference numerals 1-3 in the drawing denote these three groups.

Group 1: (Numbers Whose Indexes Leave Remainder of 1 When Divided by 3)

Index Set=(−2), (1), (4), (7), (10), (13), (16), . . . .

Group 2: (Numbers Whose Indexes Leave Remainder of 2 When Divided by 3)

Index Set=(−1), (2), (5), (8), (11), (14), (17), . . . .

Group 3: (Numbers Whose Indexes Are Divisible by 3)

Index Set=(0), (3), (6), (9), (12), (15), (18), . . . .

Since the driving force belonging to Group 1 is necessarily an integral multiple of driving force $X[(1/2)\theta]$ with index (−2), all the driving force can be implemented by (repeatedly) placing one or a plurality of transistor(s) with size $X[(1/2)\theta]$. Since the driving force belonging to Group 2 is necessarily an integral multiple of driving force $X[(1/2)\theta^2]$ with index (−1), all the driving force can be implemented by (repeatedly) placing one or a plurality of transistor(s) with size $X[(1/2)\theta^2]$. Furthermore, the driving force belonging to Group 3 is necessarily an integral multiple of driving force $X[1]$ (i.e., reference driving force) with index (0), all the driving force can be implemented by (repeatedly) placing one or a plurality of transistor(s) with the reference size $X[1]$. That is, in the figure, all the above driving force of $X[(1/2)\theta]$ or more can be implemented using the three layout devices listed in the "TRANSISTOR LAYOUT DEVICE."

Where p=3, $\theta$ which is the "third root of two" is about 1.260. When a driving force sequence in a standard cell library is in the form of geometric progression with the geometric ratio of $\theta$, the increasing rate is regarded as low. According to the present disclosure, this miniaturized driving force sequence can be implemented by a set of layout devices with three sizes except for particularly smaller driving force than $X[1]$. This enables both of miniaturization of a driving force sequence needed for high-level design and limitation of layout devices needed for highly reliable design.

Note that p may be greater if the driving force sequence needs to be more miniaturized even if the types of layout devices increase. For example, if p is increased to 5, the geometric ratio $\theta$ decreases to about 1.149, thereby providing an extremely miniaturized driving force sequence. Even in this case, layout devices can be limited to only five types.

Second Embodiment

Second embodiment of the present disclosure will be described below.

In this embodiment, similar to the first embodiment, one cell function is fixed, and thus, the p/n ratio of a cell is considered to be fixed. Assume that the reference size of a transistor according to the given p/n ratio is $X[1]$, the driving force of the cell including a transistor with the reference size $X[1]$ as a transistor in an output signal driving section is reference driving force $X[1]$.

This embodiment shows providing a similar advantage of limiting layout devices, even when the geometric ratio of "power of the root of two," which is a little extended from the geometric ratio of the "root of two" is used for providing a driving force sequence in the form of geometric progression. That is, since this extension increases possible values of selectable geometric ratios, optimization of a library for high-level design can be improved. As will be described below, however, there is no need to increase the size variations of the layout devices.

A positive real number $\theta$ is obtained by the expression (1), where p is a natural number of 2 or more. Thus, the expression (1') is also valid in this embodiment. In addition, a positive real number $\omega$ is obtained by the following equation, where q is a natural number greater than 1 and smaller than p $$\omega = 2^{q/p} \quad (6)$$

That is, $\omega$ is "power q of the $p^{th}$ root of 2," and thus, the following equation is obtained.

$$\omega^p = \omega^q \quad (6')$$

Note that the same result as in the first embodiment is obtained where q is 1.

An example will be described where a driving force sequence is provided in the form of geometric progression with the geometric ratio $\omega$. First, assume that $X[1]$ itself, which is reference driving force, is included in the sequence. At this time, where the driving force sequence is greater than $X[1]$, the following values are obtained.

$$X[\omega], X[\omega^2], \ldots, X[\omega^{p-1}], X[2^q],$$

$$X[2^q \omega], X[2^q \omega^2], \ldots, X[2^q \omega^{p-1}], X[2^{2q}],$$

$$X[2^{2q}\omega], X[2^{2q}\omega^2], \ldots, X[2^{2q}\omega^{p-1}], X[2^{3q}] \quad (7)$$

The general term of the sequence (7) is expressed by $X[\omega k]$, where k is a referred natural number of 1 or more. However, the following equation is obtained from the definition (1) of $\theta$, and the definition (6) of $\omega$.

$$\omega = \theta^q \quad (8)$$

Thus, the general term can be expressed as follows.

General Term of Driving Force Greater Than $X[1]$:

$$X[\omega^k] = X[\theta^{qk}], \text{ where k is an integer of 1 or more} \quad (9)$$

When focusing on the expression (1'), it is found that all the general terms (9) of the driving force can be implemented by the following p types of transistor layout devices.

Set of Sizes of Transistor Layout Devices:

$$\{X[(1/2) \cdot \theta^s], \text{ where s is a natural number ranging from 1 to p}\} \quad (10)$$

Specifically, where k is a natural number of 1 or more, i.e., driving force $X[\omega^k]$ is greater than the reference driving force X [1], and where qk is divided by p, and the quotient is i and the remainder is j; i and j are integers of 0 or more. Driving force $X[\omega^k]$ can be implemented by the p types of layout device shown in the set (10).

Where j=0, i.e., qk is a multiple of p, it is found from $\omega^k=2^i$ that driving force $X[\omega^k]$ can be implemented by parallel connection of $2^i$ transistors with reference size X[1].

Where j is any one of 1, 2, ..., p−1, it is found from $\omega^k=2^{i+1}[(½)\theta^j]$ that driving force $X[\omega^k]$ can be implemented by parallel connection of $2^{i+1}$ transistors with size $X[(½)\cdot\theta^j]$.

The general term where driving force is X[1] or smaller can be expressed by $X[\omega^k]$, where k is 0 or a negative integer. When focusing on the equation (1'), it is found that the driving force of $X[\omega^k]$ can be implemented by the p types of layout devices shown in the expression (10), where k is within the range satisfying the following inequality.

$$qk \geq -(p-1) \quad (11)$$

Note that the condition of the expression (11) can be also expressed by the following inequality.

$$\omega^k \geq (½)\cdot\theta \quad (12)$$

To sum up, when a driving force sequence is provided in the form of geometric progression with the geometric ratio of ω given in the expression (6), the general term is driving force $X[\omega^k]$, where k is an integer. Where k is within the range satisfying the expression (12), the force can be implemented by parallel connection of the p types of layout devices shown in the set (10). Note that the set (10) has the same form as the set (5). That is, the type of layout devices increases depending on the natural number p only, not on the natural number q.

An example will be specifically described where the natural number p is 5, and the natural number q is 2. At this time, the positive real number θ is defined by $2^{1/5}$, thereby obtaining the equation $\theta^5=2$. While noting this, a geometric progression driving force sequence with the geometric ratio $\omega=2^{2/5}$ is expressed by the expression θ based on the relation $\omega=\theta^2$ to obtain the table "GEOMETRIC PROGRESSION DRIVING FORCE SEQUENCE WITH GEOMETRIC RATIO ω" in FIG. 2. In the table, the numbers such as (1) above $X[\theta^2]$, and (5) above X[4] are the values of power where the ratio of the driving force to the reference driving force X[1] is expressed by a power of the geometric ratio $\omega(=\theta^2)$. For convenience of explanation, the values of power are used as indexes of driving force. For example, $X[\theta^2]$ is X[ω], and is thus the "(1)$^{st}$ driving force." X[4] is $X[\omega^5]$, and is thus the "(5)$^{th}$ driving force." Furthermore, $X[(½)\theta]$ is $X[\omega^{-2}]$, and is thus the "(−2)$^{nd}$ driving force." At this time, where the minimum driving force is $X[(½)\theta]$ and the maximum driving force is X[64] in the driving force sequence, indexes are arranged from index (−2) to index (15) in the order of increasing the indexes one by one. In the table, the driving force of $X[(½)\theta]$ or more, i.e., the driving force with indexes of (−2) or more is divided into five groups by classifying the indexes by residues of 5 (i.e., p). Reference numerals 11-15 in the drawings denote the above groups.

Group 11: (Numbers Whose Indexes Leave Remainder of 1 When Divided by 5)

Index Set=(1), (6), (11)

Group 12: (Numbers Whose Indexes Leave Remainder of 2 When Divided by 5)

Index Set=(2), (7), (12)

Group 13: (Numbers Whose Indexes Leave Remainder of 3 When Divided by 5)

Index Set=(−2), (3), (8), (13)

Group 14: (Numbers Whose Indexes Leave Remainder of 4 When Divided by 5)

Index Set=(−1), (4), (9), (14)

Group 15: (Numbers Whose Indexes Are Divisible by 5)

Index Set=(0), (5), (10), (15)

Since the driving force belonging to Group 11 is necessarily an integral multiple of driving force $X[(½)\theta^2]$, all the driving force can be implemented by (repeatedly) placing one or a plurality of transistor(s) with size $X[(½)\theta^2]$. Since the driving force belonging to Group 12 is necessarily an integral multiple of driving force $X[(½)\theta^4]$, all the driving force can be implemented by (repeatedly) placing one or a plurality of transistor(s) with size $X[(½)\theta^4]$. Since the driving force belonging to Group 13 is necessarily an integral multiple of driving force $X[(½)\theta]$, all the driving force can be implemented by (repeatedly) placing one or a plurality of transistor(s) with size $X[(½)\theta]$. Since the driving force belonging to Group 14 is necessarily an integral multiple of driving force $X[(½)\theta^3]$, all the driving force can be implemented by (repeatedly) placing one or a plurality of transistor(s) with size $X[(½)\theta^3]$. Furthermore, the driving force belonging to Group 15 is necessarily an integral multiple of driving force X[1] (i.e., reference driving force), all the driving force can be implemented by (repeatedly) placing one or a plurality of transistor(s) with the reference size X[1]. That is, in the figure, all the above driving force of $X[(½)\theta]$ or more can be implemented using the five layout devices listed in the "TRANSISTOR LAYOUT DEVICE."

Where p=5, and q=2, ω which is the "square of the fifth root of two" is about 1.320. Geometric progression with the geometric ratio of ω is regarded as fine as an increasing rate in a driving force sequence of cells in a standard cell library. The geometric ratio in this embodiment slightly differs from that in the first embodiment where the geometric ratio is the "third root of two," i.e., about 1.260. The slight difference possibly means as a difference in optimization of a library when the standard cell library is actually used in the design. It depends on individual specific design which geometric ratio is optimum. A system expanded from the geometric ratio of the "root of two" to the geometric ratio of the "power of the root of two" is advantageous in expanding the alternatives of the geometric ratio.

Furthermore, for example, where driving force sequences of two cell functions of a cell function A and a cell function B are provided according to the geometric ratio of the "power of the root of two," and cells are designed with a same p/n ratio; the geometric ratios can be selected from the form of the "power of the p$^{th}$ root of two," thereby implementing both the driving force sequences using common p types of layout devices. That is, fine geometric progression driving force sequences with different geometric ratios can be implemented by common discrete and limited layout devices. This will be described in detail in the following third embodiment.

Third Embodiment

Then, a third embodiment of the present disclosure will be described.

In the design of an actual standard cell library, forming a most highly miniaturized driving force sequence across all cell functions is not preferable, since the number of cells in the standard cell library becomes too large. It is thus preferable to sort cell functions into cell functions requiring miniaturized driving force sequences and the other cell functions, and to optimize miniaturization of the driving force sequence of each of the cell functions requiring the miniaturized driving force sequence to a necessary and sufficient level. In this embodiment, when the p/n ratios of the cell are the same, with respect to two cell functions having miniaturized geometric progression driving force sequences with different increasing rates, a common layout device for forming transistors of an output signal driving section can be used.

Note that equalizing the p/n ratios between different cell functions may be sufficiently appropriate to design needs on the standard cell library, while depending on the degree. For example, when a cell having a two-input AND function has a two-stage structure of a two-input NAND circuit at an earlier stage and an INVERTER circuit in an output signal driving section at a later stage, it means that the p/n ratio of this two-input AND cell means the p/n ratio of the INVERTER circuit at the latter stage. Using a common p/n ratio between the two-input AND cell and the INVERTER cell (hereinafter referred to as "INV cell") is highly possible. At this time, for example, a driving force sequence of an INV cell needs to be much miniaturized, while there is no need to sufficiently miniaturize the driving force sequence of the two-input AND cell. Alternately, as another example, a two-input NAND cell and an INV cell may be designed to have the same the p/n ratio. In this case, driving force sequences of the both cell functions need to be relatively miniaturized in a library, but the increasing rates of the both sequences are not equal, and the industry may demand to optimize miniaturization of slightly different increasing rates of driving force sequences. Based on this assumption, this embodiment aims to sort driving force sequences and standardize layout devices.

Assume that cells for cell function A and cells for cell function B are designed in a standard cell library with the same p/n ratio. In both the cell function A and the cell function B, driving force sequences are desired to be relatively fine in a library. The driving force sequence of the cell function B has a great increasing rate compared to the driving force sequence of the cell function A. In this case, when the driving force sequences are both provided in the form of geometric progression, and the geometric ratios are selected from the "power of the $p^{th}$ root of two," where p is the same number; the driving force sequences of the both cells can be formed by using common p types of layout devices which are discrete and limited.

Since the cells for the cell function A and the cells for the cell function B have the same p/n ratio, the sizes of the transistors in the output signal driving section can be expressed in common using a single size X[1] as a reference. However, the cell functions are different, the driving force cannot be standardized. Thus, assume that driving force is $X_1[1]$ where the cells for the cell function A include transistors of the reference size X[1] as transistors in output driving sections, and the driving force is the reference driving force of the cell function A. Similarly, assume that driving force is $X_2[1]$ where the cells for the cell function B include transistors of the reference size X[1] as transistors in output driving sections, and the driving force is the reference driving force of the cell function B.

Where p is a natural number of 2 or more, and the positive real number θ is obtained from the above expression (1). The expression (1') is also valid. Where q is a natural number greater than 1 and smaller than p, positive real number ωl is obtained from the following expression.

$$\omega_1 = 2^{q/p} \tag{13}$$

That is, $\omega_1$ is the "$q^{th}$ power of the $p^{th}$ root of 2," and thus, the following expression is valid.

$$\omega_1^p = 2^q \tag{13'}$$

Then, r is a natural number greater than the q and smaller than p. The positive real number $\omega_2$ is obtained from the following expression.

$$\omega_2 = 2^{r/p} \tag{14}$$

That is, $\omega_2$ is the "$r^{th}$ power of the $p^{th}$ root of 2," and thus, the following expression is valid.

$$\omega_2^p = 2^r \tag{14'}$$

Then, assume that the driving force sequence of the cell function A is provided in the form of geometric progression with the geometric ratio $\omega_1$, and the driving force sequence of the cell function B is provided in the form of geometric progression with the geometric ratio $\omega_2$. Since the both have geometric ratios of the "power of the $p^{th}$ root of two," the geometric ratio $\omega_2$ is higher than the geometric ratio $\omega_1$ from the expression q<r, the driving force sequence of the cell function B has a large increasing rate and is less miniaturized compared to that of the cell function A.

First, see the driving force sequence of the cell function A in the form of geometric progression with the geometric ratio of the $\omega_1$. Since $X_1[1]$ itself, which is the reference driving force, is included in this sequence, the driving force sequence with greater driving force than $X_1[1]$ is as follows.

$$X_1[\omega_1], X_1[\omega_1^2], \ldots, X_1[\omega_1^{p-1}], X_1[2^q],$$

$$X_1[2^q\omega_1], X_1[2^q\omega_1^2], \ldots, X_1[2^q\omega_1^{p-1}], X_1[2^{2q}],$$

$$X_1[2^{2q}\omega_1], X_1[2^{2q}\omega_1^2], \ldots, X_1[2^{2q}\omega_1^{p-1}], X_1[2^{3q}] \tag{15}$$

The general term of sequence (15) is expressed by $X[\omega_1^k]$ where k is a preferred natural number of 1 or more. The following expression is obtained from definition (1) of θ and definition (13) of ω1.

$$\omega_1 = \theta^q \tag{16}$$

The general term can be thus expressed as follows.
General Term of Driving Force Greater Than $X_1[1]$:

$$X_1[\omega_1^k] = X_1[\theta^{qk}], \text{ where k is an integer of 1 or more.} \tag{17}$$

Focusing on the above expression (1'), the general term (17) of the driving force is implemented by the following p types of transistor layout devices.
Set of Sizes of Transistor Layout Devices:

$$\{X[(\frac{1}{2}) \cdot \theta^s]: \text{ where s is a natural number ranging from 1 to p}\} \tag{18}$$

Specifically, where k is a natural number of 1 or more, i.e., where driving force $X_1[\omega_1^k]$ is greater than reference driving force X[1], and the quotient is i and the remainder is j when dividing qk by p; i and j is an integer of 0 or more. The driving force $X_1[\omega_1^k]$ can be implemented using the p types of layout devices of the set (18) as follows.

Where j=0, i.e., qk is a multiple of p, driving force $X_i[\omega_1^k]$ is $2^i$ times as great as the reference driving force $X_1[1]$ from $\omega_1^k = 2^i$, and thus can be implemented by parallel connection of $2^i$ layout devices with reference size X[1].

Where j is any one of 1, 2, ..., p−1, driving force $X_1[\omega_1^k]$ is $2^{i+1}$ times as great as driving force $X_1[(\frac{1}{2})\theta^j]$ from $\omega_1^k = 2^{i+1}[(\frac{1}{2})\theta^j]$, and thus can be implemented by parallel connection of $2^{i+1}$ layout devices with size $X[(\frac{1}{2}) \cdot \theta^j]$.

The general term where the driving force is $X_1[1]$ or less is expressed by $X_1[\omega_1^k]$ where k is 0 or a negative integer. Focusing on the above expression (1'), where k is within the range satisfying the following inequality, it is found that the driving force of $X_1[\omega_1^k]$ can be implemented using p types of layout devices of the set (18).

$$qk \geq -(p-1) \tag{19}$$

Note that the condition expressed by the above expression (19) can be rewritten into the following inequality.

$$\omega_1^k \geq (1/2) \cdot \theta \quad (20)$$

That is, the general term of the driving force sequence of the cell function A is driving force $X_1[\omega_1^k]$ where k is an integer, and can be implemented by using the p types of layout devices of the set (18) in parallel as long as k is within the range satisfying the above expression (20).

Then, see the driving force sequence of the cell function B in the form of geometric progression with the geometric ratio of the $\omega_2$. Since $X_2[1]$ itself, which is the reference driving force, is included in this sequence, the same discussion as the driving force sequence of the cell function A can be made. Only the point is described.

First, since there is the relation of $$\omega_2 = \theta^r \quad (21)$$

The general term of the driving force sequence of the cell function B can be expressed as follows.

General Term of Driving Force Sequence of Cell Function B:

$$X_2[\omega_2^k] = X_2[\theta^{rk}], \text{ where k is an integer} \quad (22)$$

Where k is a natural number of 1 or more, i.e., driving force $X_2[\omega_2^k]$ is greater than the reference driving force $X_2[1]$, and the quotient is i and the remainder is j when dividing rk by p; i and j are integers of 0 or more. The driving force $X_2[\omega_2^k]$ can be implemented as follows using the p types of layout devices of the set (18).

Where j=0, i.e., rk is a multiple of p, driving force $X_2[\omega_2^k]$ is $2^i$ times as great as the reference driving force $X_2[1]$ from $\omega_2^k = 2^i$, and thus can be implemented by parallel connection of $2^i$ layout devices with reference size $X[1]$.

Where j is any one of 1, 2, ..., p−1, driving force $X_2[\omega_2^k]$ is $2^{i+1}$ times as great as driving force $X_2[(1/2)\theta^j]$ from $\omega_2^k = 2^{i+1}[(1/2)\theta^j]$, and thus can be implemented by parallel connection of $2^{i+1}$ layout devices with size $X[(1/2)\cdot\theta^j]$.

Where the driving force is $X_2[1]$ or less, k may be 0 or a negative integer with the general term (22). Focusing on the above expression (1'), where k is within the range satisfying the following inequality, $$rk \geq -(p-1) \quad (23)$$

it is found that the driving force of $X_2[\omega_2^k]$ can be implemented using p types of layout devices of the set (18). Note that the condition expressed by the above expression (23) can be rewritten into the following inequality.

$$\omega_2^k \geq (1/2) \cdot \theta \quad (24)$$

That is, the general term of the driving force sequence of the cell function B is driving force $X_2[\omega_2^k]$ where k is an integer, and can be implemented by using the p types of layout devices of the set (18) in parallel as long as k is within the range satisfying the above expression (24).

Thus, it is clarified that both the driving force sequence of the cell function A and the driving force sequence of the cell function B can be implemented using the p types of layout devices of the set (18) by selecting the geometric ratio from the "power of the $p^{th}$ root of two," where cells are designed with the same P/N ratio. That is, driving force sequences having different geometric ratios can be implemented by common discrete and limited layout devices.

An example will be specifically described where the natural number p is 5, the natural number q is 2, and the natural number r is 3. At this time, $\theta^5 = 2$, since the positive real number θ is defined by $2^{1/5}$. The table "DRIVING FORCE SEQUENCE 1 (GEOMETRIC RATIO $\omega_1 = 2^{2/5} = \theta^2$)" in FIG. 3 illustrates a geometric progression driving force sequence with the geometric ratio $\omega_1 = 2^{2/5}$ with the expression θ based on the relation $\omega_1 = \theta^2$. In the table, the numbers such as (1) above $X_1[\theta^2]$ and (5) above $X_1[4]$ are the values of power where the ratio of the driving force to the reference driving force $X_1[1]$ is expressed by a power of the geometric ratio $\omega_1 (=\theta^2)$. For convenience of explanation, the values of power are used as indexes of driving force. For example, $X_1[\theta^2]$ is $X_1[\omega_1]$, and is thus the "(1)$^{st}$ driving force." $X_1[4]$ is $X_1[\omega_1^5]$, and is thus the "(5)$^{th}$ driving force." Furthermore, $X_1[(1/2)\theta]$ is $X_1[\omega_1^{-2}]$, and is thus the "(−2)$^{nd}$ driving force." At this time, where the minimum driving force is $X_1[(1/2)\theta]$ and the maximum driving force is $X_1[64]$ in the driving force sequence, indexes are arranged from index (−2) to index (15) in the order of increasing the indexes one by one. In the table, the driving force of $X_1[(1/2)\theta]$ or more, i.e., the driving force with indexes of (−2) or more is divided into five groups by classifying the indexes by residues of 5 (i.e., p). Reference numerals 21-25 in the drawings denote the above groups.

Group 21: (Numbers Whose Indexes Leave Remainder of 1 When Divided by 5)
Index Set=(1), (6), (11)
Group 22: (Numbers Whose Indexes Leave Remainder of 2 When Divided by 5)
Index Set=(2), (7), (12)
Group 23: (Numbers Whose Indexes Leave Remainder of 3 When Divided by 5)
Index Set=(−2), (3), (8), (13)
Group 24: (Numbers Whose Indexes Leave Remainder of 4 When Divided by 5)
Index Set=(−1), (4), (9), (14)
Group 25: (Numbers Whose Indexes Are Divisible by 5)
Index Set=(0), (5), (10), (15)

Since the driving force belonging to Group 21 is necessarily an integral multiple of driving force $X_1[(1/2)\theta^2]$, all the driving force can be implemented by (repeatedly) placing one or a plurality of transistor(s) with size $X[(1/2)\theta^2]$. Since the driving force belonging to Group 22 is necessarily an integral multiple of driving force $X_1[(1/2)\theta^4]$, all the driving force can be implemented by (repeatedly) placing one or a plurality of transistor(s) with size $X[(1/2)\theta^4]$. Since the driving force belonging to Group 23 is necessarily an integral multiple of driving force $X_1[(1/2)\theta]$, all the driving force can be implemented by (repeatedly) placing one or a plurality of transistor(s) with size $X[(1/2)\theta]$. Since the driving force belonging to Group 24 is necessarily an integral multiple of driving force $X_1[(1/2)\theta^3]$, all the driving force can be implemented by (repeatedly) placing one or a plurality of transistor(s) with size $X[(1/2)\theta^3]$. Furthermore, since the driving force belonging to Group 25 is necessarily an integral multiple of driving force $X_1[1]$ (i.e., reference driving force), all the driving force can be implemented by (repeatedly) placing one or a plurality of transistor(s) with the reference size $X[1]$. That is, all the above driving force of $X_1[(1/2)\theta^2]$ or more can be implemented using the five layout devices listed in the "TRANSISTOR LAYOUT DEVICE" of FIG. 3.

The table of "DRIVING FORCE SEQUENCE 2 (GEOMETRIC RATIO $\omega_2 = 2^{3/5} = \theta^3$)" in FIG. 3 illustrates a geometric progression driving force sequence with the geometric ratio $\omega_1 = 2^{3/5}$ with the expression θ based on the relation $\omega_2 = \theta^3$. In the table, the numbers such as (1) above $X_2[\theta^3]$ and (5) above $X_2[8]$ are the values of power where the ratio of the driving force to the reference driving force $X_2[1]$ is expressed by a power of the geometric ratio $\omega_2 (=\theta^3)$. For convenience of explanation, the values of power are used as indexes of driving force. For example, $X_2[\theta^3]$ is $X_2[\omega_2]$, and is thus the "(1)$^{st}$ driving force." $X_2[8]$ is $X_2[\omega_2^5]$, and is thus the "(5)$^{th}$ driving force." Furthermore, $X_2[(\frac{1}{2})\theta^3]$ is $X_2[\omega_2^{-1}]$, and is thus the "$(-1)^{st}$ driving force." At this time, where the minimum driving force is $X_2[(\frac{1}{2})\theta^2]$ and the maximum driving force is $X_2[64]$ in the driving force sequence, indexes are arranged from index $(-1)$ to index (10) in the order of increasing the indexes one by one. In the table, the driving force of $X_2[(\frac{1}{2})\theta^2]$ or more, i.e., the driving force with indexes of $(-1)$ or more is divided into five groups by classifying the indexes by residues of 5 (i.e., p). Reference numerals 31-35 in the drawings denote the above groups.

Group 31: (Numbers Whose Indexes Leave Remainder of 1 When Divided by 5)
Index Set=(1), (6)
Group 32: (Numbers Whose Indexes Leave Remainder of 2 When Divided by 5)
Index Set=(2), (7)
Group 33: (Numbers Whose Indexes Leave Remainder of 3 When Divided by 5)
Index Set=(3), (8)
Group 34: (Numbers Whose Indexes Leave Remainder of 4 When Divided by 5)
Index Set=(-1), (4), (9)
Group 35: (Numbers Whose Indexes Are Divisible by 5)
Index Set=(0), (5), (10)

Since the driving force belonging to Group 31 is necessarily an integral multiple of driving force $X_2[(\frac{1}{2})\theta^3]$, all the driving force can be implemented by (repeatedly) placing one or a plurality of transistor(s) with size $X[(\frac{1}{2})\theta^3]$. Since the driving force belonging to Group 32 is necessarily an integral multiple of driving force $X_2[(\frac{1}{2})\theta]$, all the driving force can be implemented by (repeatedly) placing one or a plurality of transistor(s) with size $X[(\frac{1}{2})\theta]$. Since the driving force belonging to Group 33 is necessarily an integral multiple of driving force $X_2[(\frac{1}{2})\theta^4]$, all the driving force can be implemented by (repeatedly) placing one or a plurality of transistor(s) with size $X[(\frac{1}{2})\theta^4]$. Since the driving force belonging to Group 34 is necessarily an integral multiple of driving force $X_2[(\frac{1}{2})\theta^2]$, all the driving force can be implemented by (repeatedly) placing one or a plurality of transistor(s) with size $X[(\frac{1}{2})\theta^2]$. Furthermore, since the driving force belonging to Group 35 is necessarily an integral multiple of driving force $X_2[1]$ (i.e., reference driving force of the sequence 2), all the driving force can be implemented by (repeatedly) placing one or a plurality of transistor(s) with the reference size $X[1]$. That is, all the above driving force of $X_2[(\frac{1}{2})\theta^2]$ or more can be implemented using the five layout devices listed in the "TRANSISTOR LAYOUT DEVICE" of FIG. 3.

To sum up, it is clarified that both of all the driving force in the [Driving Force Sequence 1 (Geometric Ratio $\gamma_1=2^{2/5}=\theta^2$)] and all the driving force in the [Driving Force Sequence 2 (Geometric Ratio $\omega_2=2^{3/5}=\theta^3$)] can be implemented by the five layout devices listed in the "TRANSISTOR LAYOUT DEVICE."

Where p=5, q=2, and r=3, since the value obtained from $\omega_1=2^{2/5}$ is about 1.320, and $\omega_2=2^{3/5}$ is about 1.516, there is a significant difference in miniaturization among geometric progression driving force sequences having these geometric ratios. The geometric progression driving force sequences can be formed only with five layout devices.

Where p=5, q=1, and r=2, since the value obtained from $\omega_1=2^{1/5}$ is about 1.149, and $\omega_2=2^{2/5}$ is about 1.320, geometric progression driving force sequences having these geometric ratios are highly miniaturized. In particular, geometric progression driving force sequences with the geometric ratio $\omega_1$ have a significantly low increasing rate. The geometric progression driving force sequences can be formed only with five layout devices.

In this embodiment, possibility of whether or not miniaturized geometric progression driving force sequences for two different cell functions and having different increasing rates can be implemented by common layout devices has been discussed. The above discussion was made under only the two kinds of assumption: that the cells for the cell function A and the cells for the cell function B are designed with the same P/N ratios, and that driving force sequences are designed in geometric progression with the geometric ratio of the "power of the $p^{th}$ root of two" using the same natural number p. Therefore, the discussion is actually valid even when the cell function A and the cell function B are the same. In this embodiment, advantages of using two types of geometric progression driving force sequences with different increasing rate for a single cell function will be mentioned.

In a standard cell library particularly used for the design of a high-speed circuit, basic functional cells such as an inverter require driving force sequences up to considerably great driving force. At that time, a large number of cells are required to implement miniaturized geometric progression driving force sequences from the reference driving force to the considerably great driving force. In general, reducing the increasing rate is considered to be effective in a part of a standard cell library with comparatively small driving force to reduce power consumption of a circuit, and increasing the maximum driving force is considered to be necessary to enhance speed capacity of the circuit. Reducing the increasing rate in the part with the comparatively small driving force and increasing the increasing rate in a part with great small driving force to cover driving force as great as possible are effective in reducing expansion of the number of cells while maintaining optimality as a library. That is, it is necessary to implement two types of driving force sequences for a single cell function with different increasing rates in the part with the comparatively small driving force and the part with the comparatively great driving force. In this case, cells are designed with a same P/N ratio. Thus, from the discussion on this embodiment, when the two types of geometric ratios are selected from the geometric ratios of the "power of the $p^{th}$ root of two," where p is the same number, driving force sequences can be designed in the geometric progression commonly using the p types of layout devices.

Assume that the natural number p is 5, and the positive real number $\theta$ is defined by $2^{2/5}$. The table "DRIVING FORCE SEQUENCE" of FIG. 11 illustrates an example of driving force sequences for a single cell function in which a driving force sequence is in the form of geometric progression with the geometric ratio $\theta^2$ in a part with small driving force, and a driving force sequence is in the form of geometric progression with the geometric ratio $\theta^3$ in a part with great driving force. In this table, numerals such as <1> and <2> are simply sequentially assigned from the smallest driving force to the greatest driving force. The characters from $X[(\frac{1}{2})\theta]$ of <1> to $X[4\theta^2]$ of <9> denote geometric progression driving force sequences with the geometric ratio $\theta^2$, and the characters from $X[4\theta^2]$ of <9> to $X[64]$ of <15> denote geometric progression driving force sequences with the geometric ratio $\theta^3$. In this embodiment, in the above-described FIG. 3, the driving force of the "driving force sequence 1" from index (-2) to index (6), and the driving force of the "driving force sequence 2" from index (4) to index (10) are selected and are aligned in a line while noting that $X[4\theta^2]$ is commonly included, thereby forming the "driving force sequence" of FIG. 11. Therefore, it is found that the "driving force sequence" of FIG. 11 can be implemented by five "transistor layout devices" in FIG. 3.

In the case of the "driving force sequence 1" of FIG. 3, the range covered by 18 types of driving force is covered by 15 types of driving force in the "driving force sequence" of FIG. 11. This shows that an advantage in reducing the number of cells is provided. Further reduction is possible by reviewing the point changing the geometric ratio, and the geometric ratio of the part with great driving force.

Fourth Embodiment

A fourth embodiment according to the present disclosure is described.

In all the first, second, and third embodiments, a transistor of an output signal driving section is implemented by repeatedly placing transistor layout devices of a single size in parallel. In this embodiment, a slight error in driving force is acceptable, and layout devices with different sizes are combined to approximately implement driving force, thereby enabling large reduction in the number of layout devices arranged in parallel. This will be described based on two specific examples.

A first example shows the case of p=3, where a driving force sequence is in the form of geometric progression, and the geometric ratio is the "$p^{th}$ root of 2." Since this example is the same as the example of FIG. 1 used in the description of the first embodiment, the reference characters and notations are used in the same sense. For example, θ is a positive real number, and defined by $2^{1/3}$. Also, the indexes assigned to driving force are the same. The table [GEOMETRIC PROGRESSION DRIVING FORCE SEQUENCE WITH GEOMETRIC RATIO θ] of FIG. 4 illustrates the sequence which is the same as the driving force sequence of FIG. 1 according to the first embodiment where index is (−2) or more, i.e., the driving force is X[(½)·θ] or more. The table of FIG. 4 further shows the number of devices arranged in parallel for implementing the driving force by parallel arrangement of layout devices. For example, it has been described in the first embodiment that driving force X[θ] belongs to group 1 and can be thus implemented by repeatedly placing transistors of size X[(½)θ]. The specific number of the devices is two. Note that the set of layout devices listed in the "TRANSISTOR LAYOUT DEVICE" of FIG. 4 are the same as the set (5) in the first embodiment where p=3. However, the set of the sizes are shown below for convenience of reference.

Set of Sizes of Transistor Layout Devices $$\{X[(½)·θ], X[(½)·θ^2], X[1]\} \quad (25)$$

In the design of an actual semiconductor integrated circuit, since there exists the minimum unit of length called "design grid," the exact size such as transistor size X[(½)·θ] indicated by θ=$2^{1/3}$ cannot be used in the design without any change. Assume that the design grid corresponds to $\frac{1}{1000}$ of the reference size X[1]. At that time, three types of layout devices of the set (25) are rewritten into numerical values used in the design to form the list "TRANSISTOR LAYOUT DEVICES INDICATED BY NUMERICAL VALUES" in FIG. 5, and are shown below as set (26) for convenience of reference.

Set of Sizes of Transistor Layout Devices (Indicated by Numerical Values):

$$\{X[0.630], X[0.794], X[1.000]\} \quad (26)$$

When rewritten from θ indication to numerical indication, the table of driving force is as shown in the table [APPROXIMATION TO GEOMETRIC PROGRESSION DRIVING FORCE SEQUENCE WITH GEOMETRIC RATIO θ] of FIG. 5. Each driving force in the table of FIG. 5 corresponds to driving force in the table of FIG. 4 via an index. For example, driving force X[θ] of index (1) in the table of FIG. 4 is rewritten into driving force X [1.260] of the same index (1) in the table of FIG. 5. Driving force X[8θ²] of index (11) in the table of FIG. 4 is rewritten into driving force X[12.699] of the same index (11) in the table of FIG. 5. The set (26) of layout devices indicated by numerical values is compared to the numerical values of driving force in the table of driving force sequences in FIG. 5. It is found from the comparison that as part of driving force, there is no need to stick to a single type of layout device, i.e., a layout device exactly corresponding to the group classification of FIG. 1 according to the first embodiment. Highly accurate approximate driving force is obtained using layout devices X[1.000] as many as possible and supplementarily using other types of device. For example, driving force X [40] of index (7) is X[5.040] when indicated by a numerical value. When the value is approximated by X[5.000], the driving force can be implemented by arranging five layout devices X[1.000] in parallel. The error of the driving force at that time is only 0.8% in the direction in which the driving force decreases. On the other hand, the number of the layout device arranged in parallel is reduced from 8 to 5 with reduction of 37.5%. Since the cell width for the reduced devices reduces, the area of a cell can be significantly reduced without substantially changing the driving force by the approximation. There is other driving force with such effective approximation. For example, driving force X[16θ²] of index (14) is X[25.398] in a numerical value. When the value is approximated by X[25.260], the driving force can be implemented by arranging in parallel, 26 devices of 24 layout devices of X[1.000] and 2 layout devices of X[0.630]. The error of the driving force at that time is only 0.5% in the direction in which the driving force decreases. On the other hand, the number of layout device arranged in parallel is reduced from 32 to 26 with reduction of 18.7%. The table [APPROXIMATION TO GEOMETRIC PROGRESSION DRIVING FORCE SEQUENCE WITH GEOMETRIC RATIO θ] of FIG. 5 shows driving force in numerical values and in addition, the reduction rate of the approximation error and the number of devices arranged in parallel with respect to the driving force with effective approximation. It is found from intermediate driving force and high driving force of indexes (7)-(18) that the number of devices arranged in parallel can be significantly reduced in 7 of 12 levels of driving force without substantially changing the driving force.

A second example shows the case of p=5 and q=2, where a driving force sequence is in the form of geometric progression, and a geometric ratio is the "$q^{th}$ power of the $p^{th}$ root of 2." Since this example is the same as the example of FIG. 2 used in the description of the second embodiment, the reference characters and notations are used in the same sense. For example, θ is a positive real number, and defined by $2^{1/5}$. The geometric ratio ω is $2^{2/5}=θ^2$. Also, the indexes assigned to driving force are the same. The table [GEOMETRIC PROGRESSION DRIVING FORCE SEQUENCE WITH GEOMETRIC RATIO ω] of FIG. 6 illustrates the sequence which is the same as the driving force sequence of FIG. 2 according to the second embodiment. The table of FIG. 6 shows the number of the layout devices arranged in parallel to implement driving force. For example, it has been described in the second embodiment that driving force X[θ²] belongs to group 11 and can be thus implemented by repeatedly placing transistors of size X [(½)θ²]. The specific number of the device is two. Note that the set of layout devices listed in the "TRAN- SISTOR LAYOUT DEVICE" of FIG. 6 is the same as the set (10) in the second embodiment where p=5. However, the set of the sizes are shown below for convenience of reference.

Set of Sizes of Transistor Layout Devices $$\{X[(½)·\theta], X[(½)·\theta^2], X[(½)·\theta^3], X[(½)·\theta^4], X[1]\} \qquad (27)$$

Similar to the first example, assume that the design grid corresponds to ⅟₁₀₀₀ of the reference size X[1]. At that time, five types of layout devices of the set (27) are rewritten into numerical values used in the design to form the list "transistor layout devices indicated by numerical values" in FIG. 7, and are shown below as set (28) for convenience of reference.

Set of Sizes of Transistor Layout Devices (Indicated by Numerical Values):

$$\{X[0.574], X[0.660], X[0.758], X[0.871], X[1.000]\} \qquad (28)$$

When rewritten from θ indication to numerical indication, the table of driving force is as shown in the table [APPROXIMATION TO GEOMETRIC PROGRESSION DRIVING FORCE SEQUENCE WITH GEOMETRIC RATIO ω] of FIG. 7. Each driving force in the table of FIG. 7 corresponds to driving force in the table of FIG. 8 via an index. For example, driving force $X[\theta^2]$ of index (1) in the table of FIG. 6 is rewritten into driving force X [1.320] of the same index (1) in the table of FIG. 7. Driving force X[8θ] of index (8) in the table of FIG. 6 is rewritten into driving force X [9.190] of the same index (8) in the table of FIG. 7. The set (28) of the layout devices indicated by numerical values is compared to the numerical values of driving force in the table of driving force sequences in FIG. 7. It is found from the comparison that as part of driving force, there is no need to stick to a single type of layout device, i.e., a layout device exactly corresponding to the group classification of FIG. 2 according to the second embodiment. Highly accurate approximate driving force is obtained by using layout devices of X[1.000] as many as possible and supplementarily using with other types of device. For example, driving force $X[4\theta^2]$ of index (6) is X[5.278] when indicated by a numerical value. When the value is approximated by X[5.320], the driving force can be implemented by arranging in parallel, six layout devices of four layout devices X[1.000] and two layout devices X[0.660]. At that time, the error of the driving force at that time is only 0.8% in the direction in which the driving force increases. On the other hand, the number of the layout devices arranged in parallel is reduced from 8 to 6 with reduction of 25.0%. Since the cell width for the reduced devices reduces, the area of a cell can be significantly reduced without substantially changing the driving force by the approximation. There is other driving force with such effective approximation. For example, driving force $X[8\theta^3]$ of index (9) is X[12.126] when indicated by a numerical value. When the value is approximated by X[12.149], the driving force can be implemented by arranging in parallel, 13 devices of 11 layout devices of X[1.000] and 2 layout devices of X[0.574]. The error of the driving force at that time is only 0.2% in the direction in which the driving force increases. On the other hand, the number of the layout devices arranged in parallel is reduced from 16 to 13 with reduction of 18.75%. The table [APPROXIMATION TO GEOMETRIC PROGRESSION DRIVING FORCE SEQUENCE WITH GEOMETRIC RATIO ω] of FIG. 7 shows driving force indicated by numerical values and in addition, the reduction rate of the approximation error and the number of the devices arranged in parallel with respect to the driving force with effective approximation. It is found from intermediate driving force and high driving force of indexes (6)-(15) that the number of devices arranged in parallel can be significantly reduced in 8 of 10 levels of driving force without substantially changing the driving force.

Since the approximation method described above is based on specific numerical values for sizes of layout devices and transistor sizes of an output signal driving section appearing in a driving force sequence, general values p and q cannot be quantitatively discussed. However, practical advantages are clarified by showing the above two examples.

Examples of Layout Device, Layout, and Semiconductor Integrated Circuit

FIG. 8 illustrates three types of layout devices where a driving force sequence of an INV cell is implemented in the form of geometric progression with the geometric ratio θ where the geometric ratio θ is the third root of two ($\theta=2^{1/3}$) using the INV cell as an example. In the figure, the three types of layout devices are: a layout device 51 for the INV cell with reference size X[1], a layout device 52 for the INV cell with size X[(½)θ], and a layout device 53 for the INV cell with size $X[(½)\theta^2]$. Note that, in the figure, 41 denotes a cell frame indicating cell height, 42 denotes the cell height, 43 denotes a region in which p-type transistor layout devices are provided, 44 denotes a region in which n-type transistor layout devices are provided, 45 denotes a p-type transistor layout device, and 46 denotes an n-type transistor layout device.

Figure 9:
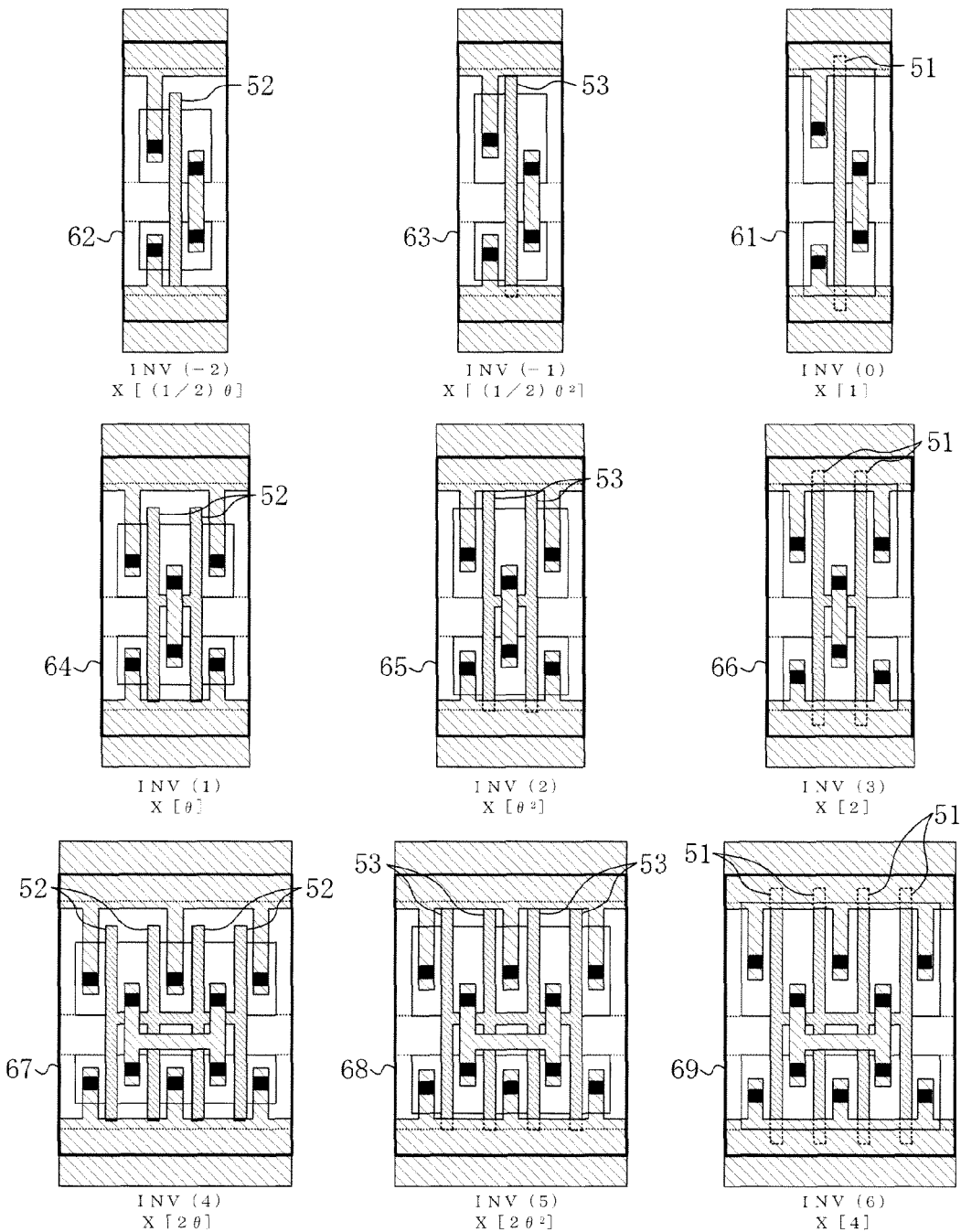
FIG. 9 illustrates a layout corresponding to driving force of an INV cell when using a driving force sequence of the INV cell for geometric progression with the geometric ratio of the third root of two.

Similarly, FIG. 9 illustrates layouts corresponding to the driving force of an INV cell where a driving force sequence of the INV cell is implemented in the form of geometric progression with a geometric ratio θ where the geometric ratio θ is the third root of two ($\theta=2^{1/3}$) using the INV cell as an example. In the figure, 61 denotes an INNV cell of index (0) corresponding to reference driving force X[1], 62 denotes an INNV cell of index (−2) corresponding to driving force X[(½)θ], 63 denotes an INNV cell of index (−1) corresponding to driving force $X[(½)\theta^2]$, 64 denotes an INNV cell of index (1) corresponding to driving force X[θ] laid out by repeatedly placing two INNV cells 62 of index (−2) corresponding to the driving force X[(½)θ]. Reference numeral 65 denotes an INNV cell of index (2) corresponding to driving force $X[\theta^2]$ laid out by repeatedly placing two INNV cells 63 of index (−1) corresponding to the driving force $X[(½)\theta^2]$. Reference numeral 66 denotes an INNV cell of index (3) corresponding to driving force X[2] laid out by repeatedly placing two INNV cells 61 of index (0) corresponding to the driving force X[1]. Furthermore, reference numeral 67 denotes an INNV cell of index (4) corresponding to driving force X[2θ] laid out by repeatedly placing two INNV cells 64 of index (−1) corresponding to the driving force X [θ]. Reference numeral 68 denotes an INNV cell of index (5) corresponding to driving force $X[2\theta^2]$ laid out by repeatedly placing two INNV cells 65 of index (2) corresponding to the driving force $X[\theta^2]$. Reference numeral 69 denotes an INNV cell of index (6) corresponding to driving force X[4] laid out by repeatedly placing two INNV cells of index (3) corresponding to the driving force X[2].

Figure 10:
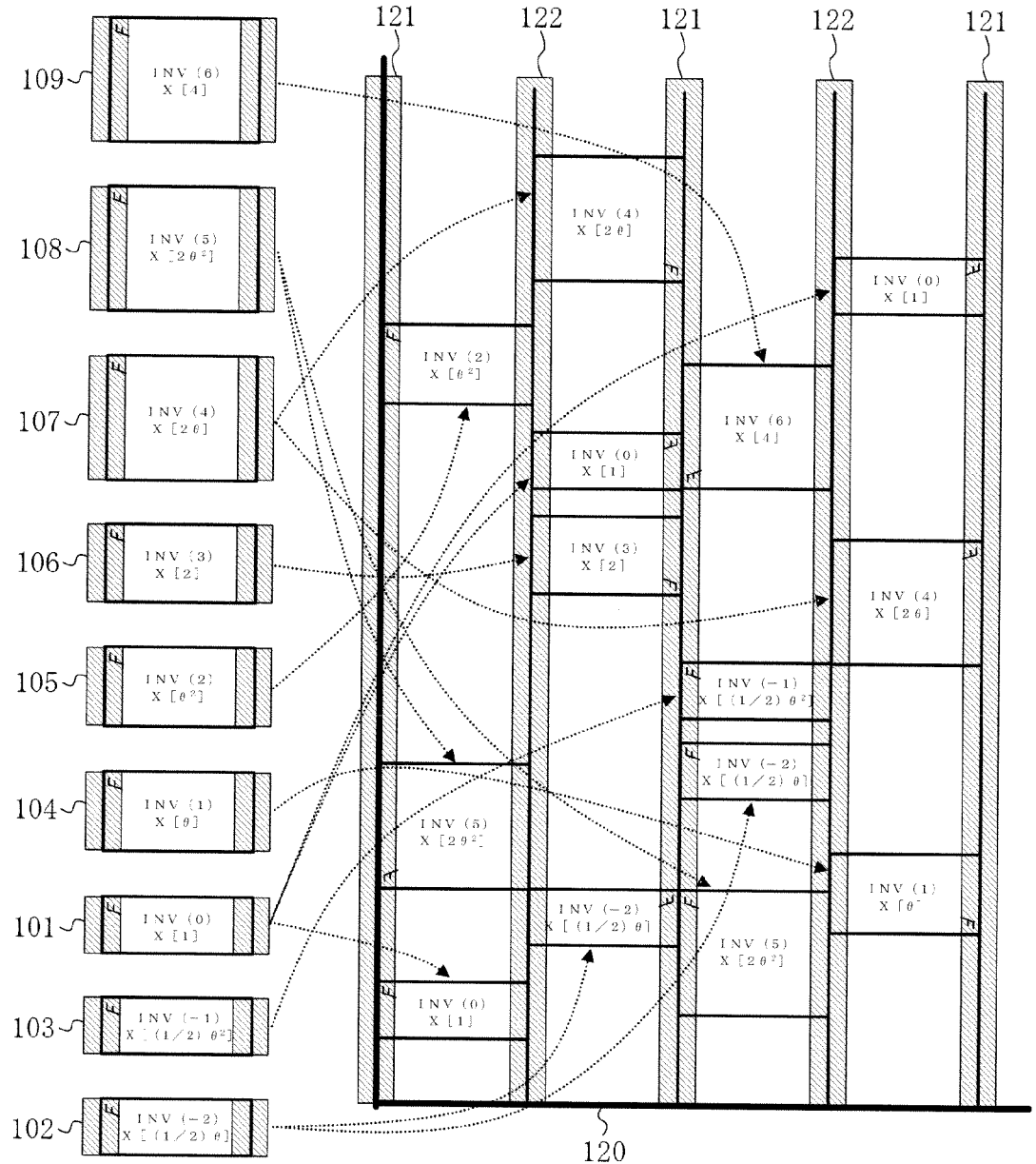
FIG. 10 illustrates a semiconductor integrated circuit designed using a standard cell library in which a driving force sequence of an INV cell has the geometric ratio of the third root of two.

Similarly, FIG. 10 illustrates that a semiconductor integrated circuit is formed by arranging INV cells in a standard cell region by a standard cell library where a driving force sequence of an INV cell is implemented in the form of geometric progression with a geometric ratio θ where the geometric ratio θ is the third root of two ($\theta=2^{1/3}$) using the INV cell as an example. At the left side of FIG. 10, nine types of INV cells are shown, which are included in a standard cell library implemented in the form of geometric progression with a geometric ratio θ, where the geometric ratio θ is the third root of two ($\theta=2^{1/3}$). Specifically, nine types are: an INV cell 101 with driving force X [1] and index (0), an INV cell 102 with driving force X [(½)θ] and index (−2), an INV cell 103 with driving force X [(½)θ²] and index (−1), an INV cell 104 with driving force X [θ] and index (1), an INV cell 105 with driving force X [θ²] and index (2), an INV cell 106 with driving force X [2] and index (3), an INV cell 107 with driving force X[2θ] and index (4), an INV cell 108 with driving force X[2θ²] and index (5), and an INV cell 109 with driving force X[4] and index (6). FIG. 10 shows an example of forming a semiconductor integrated circuit by arranging nine types of the INV cells 101-109 in a standard cell region 120. Note that, in the figure, 121 denotes interconnects to a power source (Vdd potential) and 122 denotes interconnects to ground (Vss potential). In FIG. 10, symbol F is attached to each of the nine INV cells 101-109 included in the standard cell library so that the direction of INV cell is recognized when provided on the standard cell region 120.

As described above, a standard cell library according to the present disclosure is used for a semiconductor integrated circuit, etc. including CMOS transistors mounted in various types of electronic devices.

What is claimed is:

1. A semiconductor integrated circuit comprising:
a region for a standard cell array, wherein:
a plurality of cells for at least one cell function are located in the standard cell array,
each of the plurality of cells includes an output signal driving section transistor configured to drive an output signal,
a cell group includes some of the plurality of cells having the same cell function and different sizes of output signal driving section transistors,
with respect to the transistor size in the output signal driving section of each of the plurality of cells, a specific size of a transistor layout device provided in the cell as a single device is defined as reference size X[1],
$θ^p$ is 2, where p is a natural number of 2 or more, and a positive real number θ is defined by $2^{1/p}$,
indication according to the reference size X[1] defines p types of transistor layout devices distinguished by p types of sizes expressed by $X[(1/2)·θ^s]$, where s is a natural number ranging from 1 to p,
a first cell belongs to the cell group,
the transistor size in the output signal driving section is equal to or greater than $X[(1/2)·θ]$, based on the reference size X[1], and
the transistor in the output signal driving section of the cell is laid out within the cell by repeatedly placing one or multiple ones of a transistor layout device selected from the p types of transistor layout devices in accordance with the first cell.

2. A semiconductor integrated circuit comprising:
a region for a standard cell array, wherein:
a plurality of cells for at least one cell function are located in the standard cell array,
each of the plurality of cells includes an output signal driving section transistor configured to drive an output signal,
a cell group includes some of the plurality of cells having the same cell function and different sizes of output signal driving section transistors,
a sequence of the driving force of the cell group is a sequence formed by sequentially arranging the cells belonging to the cell group from a cell with smallest driving force to a cell with greatest driving force using as an index of driving force, a relative size of a transistor size in an output signal driving section of each of the plurality of cells belonging to the cell group,
a partial sequence of a plurality of cells successively arranged in the sequence, and all the cells belonging to the partial sequence form a partial cell group, and the partial sequence forms geometric progression with respect to driving force using the index,
p is a natural number of two or more, and q is a natural number of 1 or more and less than p, and
the geometric progression has a geometric ratio substantially expressed by $2^{q/p}$.

3. The semiconductor integrated circuit of claim 2, wherein:
with respect to the transistor size in the output signal driving section of each of the plurality of cells, a specific size of a transistor layout device provided in the standard cell as a single device is defined as reference size X[1],
$θ^p$ is 2, where p is a natural number of 2 or more, and a positive real number θ is defined by $2^{1/p}$,
indication according to the reference size X[1] defines p types of transistor layout devices distinguished by p types of sizes expressed by $X[(1/2)·θ^s]$, where s is a natural number ranging from 1 to p,
a first cell belongs to the partial sequence in the form of said geometric progression with respect to said driving force,
the transistor size in the output signal driving section is equal to or greater than $X[(1/2)·θ]$, based on the reference size X[1], and
the transistor in the output signal driving section of the cell is laid out within the cell by repeatedly placing one or multiple ones of a transistor layout device selected from the p types of transistor layout devices in accordance with the first cell.

\* \* \* \* \*